(12) United States Patent
Lofy et al.

(10) Patent No.: US 10,219,407 B2
(45) Date of Patent: Feb. 26, 2019

(54) SYSTEMS AND METHODS FOR COOLING INDUCTIVE CHARGING ASSEMBLIES

(71) Applicant: GENTHERM INCORPORATED, Northville, MI (US)

(72) Inventors: John Lofy, Claremont, CA (US); David Marquette, Farmington Hills, MI (US)

(73) Assignee: GENTHERM INCORPORATED, Northville, MI (US)

( * ) Notice: Subject to any disclaimer, the term of this patent is extended or adjusted under 35 U.S.C. 154(b) by 216 days.

(21) Appl. No.: 15/268,153

(22) Filed: Sep. 16, 2016

(65) Prior Publication Data

US 2017/0164513 A1 Jun. 8, 2017

Related U.S. Application Data

(63) Continuation of application No. 13/935,321, filed on Jul. 3, 2013, now Pat. No. 9,451,723.

(Continued)

(51) Int. Cl.
*H05K 7/20* (2006.01)
*H02J 50/10* (2016.01)
*H02J 7/02* (2016.01)

(52) U.S. Cl.
CPC .......... *H05K 7/20209* (2013.01); *H02J 7/025* (2013.01); *H02J 50/10* (2016.02);
(Continued)

(58) Field of Classification Search
USPC ................................ 320/107, 108, 109, 110
See application file for complete search history.

(56) References Cited

U.S. PATENT DOCUMENTS 2,991,628 A 7/1961 Tuck
3,136,577 A 6/1964 Richard
(Continued)

FOREIGN PATENT DOCUMENTS

CN 2634396 8/2004
CN 101 827 509 9/2010
(Continued)

OTHER PUBLICATIONS

U.S. Appl. No. 15/499,404, filed Apr. 27, 2017, Lofy.
(Continued)

*Primary Examiner* — Brian Ngo
(74) *Attorney, Agent, or Firm* — Knobbe, Martens, Olson & Bear, LLP

(57) ABSTRACT

In some embodiments, a cooling system for an inductive charger includes a thermal conditioning assembly in fluid communication with an inductive charging assembly. The inductive charging assembly can include a dock and an inductive charging module. The dock can be configured to receive a portable electronic device, such as a cell phone, that is configured to accept inductive charging from the inductive charging module. The thermal conditioning assembly can include a fluid transfer device and a thermal conditioning module, such as a thermoelectric device. In various embodiments, heat (e.g., heat produced during inductive charging) can be transferred from the inductive charging assembly to the thermal conditioning module and/or to a fluid flow produced by the fluid transfer device, thereby cooling the inductive charging assembly and/or the portable electronic device.

8 Claims, 14 Drawing Sheets

Related U.S. Application Data

(60) Provisional application No. 61/668,897, filed on Jul. 6, 2012.

(52) U.S. Cl.
CPC ..... *H05K 7/20136* (2013.01); *H05K 7/20145* (2013.01); *H05K 7/20845* (2013.01)

(56) References Cited

U.S. PATENT DOCUMENTS

| | | |
|---|---|---|
| 3,137,523 A | 6/1964 | Karner |
| 3,243,965 A | 4/1966 | Jepson |
| 3,310,953 A | 3/1967 | Rait |
| 3,314,242 A | 4/1967 | Lefferts |
| 3,434,302 A | 3/1969 | Stoner et al. |
| 3,462,044 A | 8/1969 | McKenna |
| 3,713,302 A | 1/1973 | Reviel |
| 3,808,825 A | 5/1974 | Ciurea |
| 3,938,018 A | 2/1976 | Dahl |
| 4,037,428 A | 7/1977 | Giannotti |
| 4,054,037 A | 10/1977 | Yoder |
| 4,089,436 A | 5/1978 | Marks |
| 4,274,262 A | 6/1981 | Reed et al. |
| 4,301,658 A | 11/1981 | Reed |
| 4,311,017 A | 1/1982 | Reed et al. |
| D264,592 S | 5/1982 | Reed et al. |
| 4,384,512 A | 5/1983 | Keith |
| 4,413,857 A | 11/1983 | Hayashi |
| 4,581,898 A | 4/1986 | Preis |
| 4,597,435 A | 7/1986 | Fosco, Jr. |
| 4,671,070 A | 6/1987 | Rudick |
| 4,671,567 A | 6/1987 | Frobose |
| 4,685,727 A | 8/1987 | Cremer et al. |
| 4,711,099 A | 12/1987 | Polan et al. |
| 4,738,113 A | 4/1988 | Rudick |
| 4,759,190 A | 7/1988 | Trachtenberg et al. |
| 4,870,837 A | 10/1989 | Weins |
| 4,914,920 A | 4/1990 | Carnagie et al. |
| 4,923,248 A | 5/1990 | Feher |
| 4,989,415 A | 2/1991 | Lombness |
| 5,002,336 A | 3/1991 | Feher |
| 5,042,258 A | 8/1991 | Sundhar |
| 5,051,076 A | 9/1991 | Okomo et al. |
| 5,060,479 A | 10/1991 | Carmi et al. |
| 5,077,709 A | 12/1991 | Feher |
| 5,106,161 A | 4/1992 | Meiller |
| 5,117,638 A | 6/1992 | Feher |
| 5,168,718 A | 12/1992 | Bergmann |
| D334,508 S | 4/1993 | Furtado |
| 5,230,016 A | 7/1993 | Yasuda |
| 5,283,420 A | 2/1994 | Montalto |
| 5,301,508 A | 4/1994 | Kahl et al. |
| 5,315,830 A | 5/1994 | Doke et al. |
| D350,048 S | 8/1994 | Kahl et al. |
| 5,367,879 A | 11/1994 | Doke et al. |
| 5,385,382 A | 1/1995 | Single, II et al. |
| D358,071 S | 5/1995 | Gill |
| 5,448,109 A | 9/1995 | Cachy |
| 5,572,872 A | 11/1996 | Hlavacek |
| 5,597,200 A | 1/1997 | Gregory et al. |
| 5,600,225 A | 2/1997 | Goto |
| 5,609,032 A | 3/1997 | Bielinski |
| 5,626,021 A | 5/1997 | Karunasiri et al. |
| 5,634,343 A | 6/1997 | Baker, III |
| 5,655,384 A | 8/1997 | Joslin, Jr. |
| 5,710,911 A | 1/1998 | Walsh et al. |
| 5,720,171 A | 2/1998 | Osterhoff et al. |
| 5,842,353 A | 12/1998 | Kuo-Liang |
| 5,845,499 A | 12/1998 | Monesanto |
| 5,850,741 A | 12/1998 | Feher |
| 5,862,669 A | 1/1999 | Davis et al. |
| 5,881,560 A | 3/1999 | Bielinski |
| 5,884,487 A | 3/1999 | Davis et al. |
| 5,887,304 A | 3/1999 | Von Der Heyde |
| 5,921,314 A | 7/1999 | Schuller et al. |
| 5,924,766 A | 7/1999 | Esaki et al. |
| 5,927,817 A | 7/1999 | Ekman et al. |
| 5,934,748 A | 8/1999 | Faust et al. |
| 5,941,077 A | 8/1999 | Safyan |
| 5,946,939 A | 9/1999 | Matsushima et al. |
| 5,952,814 A | 9/1999 | Van Lerberghe |
| 5,959,433 A | 9/1999 | Rohde |
| 5,970,719 A | 10/1999 | Merritt |
| 6,003,950 A | 12/1999 | Larsson |
| 6,019,420 A | 2/2000 | Faust et al. |
| 6,048,024 A | 4/2000 | Wallman |
| 6,059,018 A | 5/2000 | Yoshinori et al. |
| 6,062,641 A | 5/2000 | Suzuki et al. |
| 6,079,485 A | 6/2000 | Esaki et al. |
| 6,082,114 A | 7/2000 | Leonoff |
| 6,085,369 A | 7/2000 | Feher |
| 6,100,663 A | 8/2000 | Boys |
| 6,103,967 A | 8/2000 | Cachy et al. |
| 6,105,384 A | 8/2000 | Joseph |
| 6,119,461 A | 9/2000 | Stevick et al. |
| 6,119,463 A | 9/2000 | Bell |
| 6,121,585 A | 9/2000 | Dam |
| 6,141,969 A | 11/2000 | Launchbury et al. |
| 6,145,925 A | 11/2000 | Eksin et al. |
| 6,186,592 B1 | 2/2001 | Orizakis et al. |
| 6,189,966 B1 | 2/2001 | Faust et al. |
| 6,192,787 B1 | 2/2001 | Montalto |
| 6,196,627 B1 | 3/2001 | Faust et al. |
| 6,206,465 B1 | 3/2001 | Faust et al. |
| 6,223,539 B1 | 5/2001 | Bell |
| 6,263,530 B1 | 7/2001 | Feher |
| 6,269,653 B1 | 8/2001 | Katuša |
| 6,282,906 B1 | 9/2001 | Cauchy |
| 6,295,819 B1 | 10/2001 | Mathiprakasam et al. |
| 6,308,519 B1 | 10/2001 | Bielinski |
| 6,396,241 B1 | 5/2002 | Ramos |
| 6,401,461 B1 | 6/2002 | Harrison et al. |
| 6,401,462 B1 | 6/2002 | Bielinski |
| 6,422,024 B1 | 7/2002 | Foye |
| 6,449,958 B1 | 9/2002 | Foye |
| D467,468 S | 12/2002 | Krieger et al. |
| 6,509,704 B1 | 1/2003 | Brown |
| 6,530,232 B1 | 3/2003 | Kitchens |
| 6,541,737 B1 | 4/2003 | Eksin et al. |
| RE38,128 E | 6/2003 | Gallup et al. |
| D475,895 S | 6/2003 | Ancona et al. |
| 6,571,564 B2 | 6/2003 | Upadhye et al. |
| 6,598,251 B2 | 7/2003 | Habboub et al. |
| 6,604,785 B2 | 8/2003 | Bargheer et al. |
| 6,606,866 B2 | 8/2003 | Bell |
| 6,619,736 B2 | 9/2003 | Stowe et al. |
| 6,626,488 B2 | 9/2003 | Pfahler |
| 6,644,735 B2 | 11/2003 | Bargheer et al. |
| 6,658,857 B1 | 12/2003 | George |
| 6,676,207 B2 | 1/2004 | Rauh et al. |
| 6,700,052 B2 | 3/2004 | Bell |
| 6,711,014 B2 | 3/2004 | Anzai |
| 6,732,533 B1 | 5/2004 | Giles |
| 6,732,534 B2 | 5/2004 | Spry |
| 6,761,399 B2 | 7/2004 | Bargheer et al. |
| 6,786,541 B2 | 9/2004 | Haupt et al. |
| 6,786,545 B2 | 9/2004 | Bargheer et al. |
| 6,808,230 B2 | 10/2004 | Buss et al. |
| 6,828,528 B2 | 12/2004 | Stowe et al. |
| 6,841,957 B2 | 1/2005 | Brown |
| 6,855,880 B2 | 2/2005 | Feher |
| 6,857,697 B2 | 2/2005 | Brennan et al. |
| 6,870,135 B2 | 3/2005 | Hamm et al. |
| 6,892,807 B2 | 5/2005 | Fristedt et al. |
| 6,893,086 B2 | 5/2005 | Bajic et al. |
| 6,907,739 B2 | 6/2005 | Bell |
| 6,918,257 B2 | 7/2005 | Slone et al. |
| 6,954,944 B2 | 10/2005 | Feher |
| 6,976,734 B2 | 12/2005 | Stoewe |
| 7,022,946 B2 | 4/2006 | Sanoner et al. |
| 7,040,710 B2 | 5/2006 | White et al. |
| 7,070,232 B2 | 7/2006 | Minegishi et al. |
| 7,082,773 B2 | 8/2006 | Cauchy |
| 7,089,749 B1 | 8/2006 | Schafer |

(56) References Cited

U.S. PATENT DOCUMENTS

| | | |
|---|---|---|
| 7,108,319 B2 | 9/2006 | Hartwich et al. |
| 7,114,771 B2 | 10/2006 | Lofy et al. |
| 7,124,593 B2 | 10/2006 | Feher |
| 7,131,689 B2 | 11/2006 | Brennan et al. |
| 7,147,279 B2 | 12/2006 | Bevan et al. |
| 7,168,758 B2 | 1/2007 | Bevan et al. |
| 7,178,344 B2 | 2/2007 | Bell |
| 7,180,265 B2 | 2/2007 | Naskali et al. |
| 7,180,503 B2 | 2/2007 | Burr et al. |
| 7,201,441 B2 | 4/2007 | Stoewe et al. |
| 7,272,936 B2 | 9/2007 | Feher |
| 7,414,380 B2 | 8/2008 | Tang et al. |
| 7,425,034 B2 | 9/2008 | Bajic et al. |
| 7,462,028 B2 | 12/2008 | Cherala et al. |
| 7,475,464 B2 | 1/2009 | Lofy et al. |
| 7,480,950 B2 | 1/2009 | Feher |
| 7,506,938 B2 | 3/2009 | Brennan et al. |
| 7,587,901 B2 | 9/2009 | Petrovski |
| 7,591,507 B2 | 9/2009 | Giffin et al. |
| 7,640,754 B2 | 1/2010 | Wolas |
| 7,665,803 B2 | 2/2010 | Wolas |
| 7,683,572 B2 | 3/2010 | Toya |
| 7,708,338 B2 | 5/2010 | Wolas |
| RE41,765 E | 9/2010 | Gregory et al. |
| 7,827,620 B2 | 11/2010 | Feher |
| 7,827,805 B2 | 11/2010 | Comiskey et al. |
| 7,862,113 B2 | 1/2011 | Knoll |
| 7,866,017 B2 | 1/2011 | Knoll |
| 7,877,827 B2 | 2/2011 | Marquette et al. |
| 7,937,789 B2 | 5/2011 | Feher |
| 7,963,594 B2 | 6/2011 | Wolas |
| 7,966,835 B2 | 6/2011 | Petrovski |
| 7,996,936 B2 | 8/2011 | Marquette et al. |
| 8,065,763 B2 | 11/2011 | Brykalski et al. |
| 8,104,295 B2 | 1/2012 | Lofy |
| 8,143,554 B2 | 3/2012 | Lofy |
| 8,181,290 B2 | 5/2012 | Brykalski et al. |
| 8,191,187 B2 | 6/2012 | Brykalski et al. |
| 8,222,511 B2 | 7/2012 | Lofy |
| 8,256,236 B2 | 9/2012 | Lofy |
| 8,332,975 B2 | 12/2012 | Brykalski et al. |
| 8,400,104 B2 | 3/2013 | Adamczyk |
| 8,402,579 B2 | 3/2013 | Marquette et al. |
| 8,418,286 B2 | 4/2013 | Brykalski et al. |
| 8,434,314 B2 | 5/2013 | Comiskey et al. |
| 8,438,863 B2 | 5/2013 | Lofy |
| RE44,272 E | 6/2013 | Bell |
| 8,460,816 B2 | 6/2013 | Julstrom |
| 8,472,976 B1 | 6/2013 | Ledet |
| 8,505,320 B2 | 8/2013 | Lofy |
| 8,516,842 B2 | 8/2013 | Petrovski |
| 8,539,624 B2 | 9/2013 | Terech et al. |
| 8,575,518 B2 | 11/2013 | Walsh |
| 8,621,687 B2 | 1/2014 | Brykalski et al. |
| 8,732,874 B2 | 5/2014 | Brykalski et al. |
| 8,782,830 B2 | 7/2014 | Brykalski et al. |
| 8,893,329 B2 | 11/2014 | Petrovksi |
| 9,105,808 B2 | 8/2015 | Petrovksi |
| 9,105,809 B2 | 8/2015 | Lofy |
| 9,121,414 B2 | 9/2015 | Lofy et al. |
| 9,125,497 B2 | 9/2015 | Brykalski et al. |
| 9,310,112 B2 | 4/2016 | Bell et al. |
| 9,335,073 B2 | 5/2016 | Lofy |
| 9,366,461 B2 | 6/2016 | Bell et al. |
| 9,445,524 B2 | 9/2016 | Lofy et al. |
| 9,451,723 B2 | 9/2016 | Lofy et al. |
| 9,506,675 B1 | 11/2016 | Campbell et al. |
| 9,603,459 B2 | 3/2017 | Brykalski et al. |
| 9,622,588 B2 | 4/2017 | Brykalski et al. |
| 9,651,279 B2 | 5/2017 | Lofy |
| 9,685,599 B2 | 6/2017 | Petrovski et al. |
| 9,814,641 B2 | 11/2017 | Brykalski et al. |
| 9,861,006 B2 | 1/2018 | Lofy et al. |
| 9,989,267 B2 | 6/2018 | Brykalski et al. |
| 10,005,337 B2 | 6/2018 | Petrovski |
| 2002/0038550 A1 | 4/2002 | Gillen |
| 2002/0121096 A1 | 9/2002 | Harrison et al. |
| 2002/0162339 A1 | 11/2002 | Harrison et al. |
| 2003/0039298 A1 | 2/2003 | Eriksson et al. |
| 2003/0145380 A1 | 8/2003 | Schmid |
| 2004/0068992 A1 | 4/2004 | Cauchy |
| 2004/0090093 A1 | 5/2004 | Kamiya et al. |
| 2004/0194470 A1 | 10/2004 | Upadhye et al. |
| 2004/0255364 A1 | 12/2004 | Feher |
| 2005/0162824 A1 | 7/2005 | Thompson |
| 2005/0202310 A1* | 9/2005 | Yahnker ............... B25F 5/008 429/62 |
| 2005/0274118 A1 | 12/2005 | McMurry et al. |
| 2005/0285438 A1 | 12/2005 | Ishima et al. |
| 2006/0053529 A1 | 3/2006 | Feher |
| 2006/0053805 A1 | 3/2006 | Flinner et al. |
| 2006/0061325 A1 | 3/2006 | Tang |
| 2006/0070384 A1 | 4/2006 | Ertel |
| 2006/0087160 A1 | 4/2006 | Dong et al. |
| 2006/0117760 A1 | 6/2006 | Pieronczyk et al. |
| 2006/0117761 A1 | 6/2006 | Bormann |
| 2006/0130491 A1 | 6/2006 | Park et al. |
| 2006/0131325 A1 | 6/2006 | Wauters et al. |
| 2006/0137099 A1 | 6/2006 | Feher |
| 2006/0137358 A1 | 6/2006 | Feher |
| 2006/0150637 A1 | 7/2006 | Wauters et al. |
| 2006/0185711 A1 | 8/2006 | Bang et al. |
| 2006/0214480 A1 | 9/2006 | Terech |
| 2006/0244289 A1 | 11/2006 | Bedro |
| 2006/0273646 A1 | 12/2006 | Comiskey et al. |
| 2007/0086757 A1 | 4/2007 | Feher |
| 2007/0141453 A1* | 6/2007 | Mahalingam ......... H01M 10/42 429/120 |
| 2007/0152633 A1 | 7/2007 | Lee |
| 2007/0200398 A1 | 8/2007 | Wolas et al. |
| 2007/0204629 A1* | 9/2007 | Lofy .................... B60N 3/104 62/3.61 |
| 2007/0214799 A1 | 9/2007 | Goenka |
| 2007/0251016 A1 | 11/2007 | Feher |
| 2007/0262621 A1 | 11/2007 | Dong et al. |
| 2008/0000025 A1 | 1/2008 | Feher |
| 2008/0087316 A1 | 4/2008 | Inaba et al. |
| 2008/0164733 A1 | 7/2008 | Giffin et al. |
| 2008/0166224 A1 | 7/2008 | Giffin et al. |
| 2008/0173023 A1 | 7/2008 | Wu |
| 2008/0178920 A1 | 7/2008 | Ullo |
| 2009/0000031 A1 | 1/2009 | Feher |
| 2009/0015027 A1 | 1/2009 | Lambarth et al. |
| 2009/0026813 A1 | 1/2009 | Lofy |
| 2009/0033130 A1 | 2/2009 | Marquette et al. |
| 2009/0096413 A1 | 4/2009 | Partovi et al. |
| 2009/0126110 A1 | 5/2009 | Feher |
| 2009/0139781 A1 | 6/2009 | Straubel |
| 2009/0158751 A1 | 6/2009 | Yu et al. |
| 2009/0211619 A1 | 8/2009 | Sharp et al. |
| 2009/0218855 A1 | 9/2009 | Wolas |
| 2009/0288800 A1 | 11/2009 | Kang et al. |
| 2009/0298553 A1 | 12/2009 | Ungari et al. |
| 2010/0290215 A1 | 11/2010 | Metcalf et al. |
| 2011/0005951 A1* | 1/2011 | Baumgartner ......... B25H 3/006 206/349 |
| 2011/0015652 A1 | 1/2011 | Sladecek |
| 2011/0259018 A1 | 10/2011 | Lee |
| 2011/0260681 A1 | 10/2011 | Guccione et al. |
| 2011/0267769 A1 | 11/2011 | Nakamura et al. |
| 2011/0271994 A1 | 11/2011 | Gilley |
| 2011/0289939 A1 | 12/2011 | Lu |
| 2012/0071082 A1* | 3/2012 | Karamanos ........... F24F 5/0003 454/284 |
| 2012/0080911 A1 | 4/2012 | Brykalski et al. |
| 2012/0117730 A1 | 5/2012 | Lemire et al. |
| 2012/0217772 A1 | 8/2012 | Tang |
| 2012/0228904 A1 | 9/2012 | Mouradian |
| 2012/0235501 A1 | 9/2012 | Kesler et al. |
| 2012/0261399 A1 | 10/2012 | Lofy |
| 2012/0325281 A1 | 12/2012 | Akiyama |
| 2013/0086923 A1 | 4/2013 | Petrovski et al. |
| 2013/0097776 A1 | 4/2013 | Brykalski et al. |
| 2013/0097777 A1 | 4/2013 | Marquette et al. |

(56) References Cited

U.S. PATENT DOCUMENTS

| | | |
|---|---|---|
| 2013/0206852 A1 | 8/2013 | Brykalski et al. |
| 2013/0234656 A1 | 9/2013 | Lambert |
| 2013/0239592 A1 | 9/2013 | Lofy |
| 2013/0278075 A1 | 10/2013 | Kurs et al. |
| 2014/0007594 A1* | 1/2014 | Lofy .................. H05K 7/20845 62/3.2 |
| 2014/0026320 A1 | 1/2014 | Marquette et al. |
| 2014/0030082 A1 | 1/2014 | Helmenstein |
| 2014/0090513 A1 | 4/2014 | Zhang et al. |
| 2014/0090829 A1 | 4/2014 | Petrovski |
| 2014/0131343 A1 | 5/2014 | Walsh |
| 2014/0159442 A1 | 6/2014 | Helmenstein |
| 2014/0180493 A1 | 6/2014 | Csonti et al. |
| 2014/0187140 A1 | 7/2014 | Lazanja et al. |
| 2014/0194959 A1 | 7/2014 | Fries et al. |
| 2014/0237719 A1 | 8/2014 | Brykalski et al. |
| 2014/0250918 A1 | 9/2014 | Lofy |
| 2014/0260331 A1 | 9/2014 | Lofy et al. |
| 2014/0305625 A1 | 10/2014 | Petrovski |
| 2014/0310874 A1 | 10/2014 | Brykalski et al. |
| 2014/0338366 A1 | 11/2014 | Adldinger et al. |
| 2015/0013346 A1 | 1/2015 | Lofy |
| 2015/0145475 A1 | 5/2015 | Partovi et al. |
| 2015/0175046 A1 | 6/2015 | Oh et al. |
| 2016/0023585 A1 | 1/2016 | Salter et al. |
| 2016/0053772 A1 | 2/2016 | Lofy et al. |
| 2016/0214521 A1 | 7/2016 | Kurtovic |
| 2016/0361968 A1 | 12/2016 | Bell et al. |
| 2017/0135490 A1 | 5/2017 | Andrix et al. |
| 2017/0164515 A1 | 6/2017 | Lofy et al. |
| 2017/0328612 A1 | 11/2017 | Lofy |
| 2017/0361676 A1 | 12/2017 | Androulakis et al. |
| 2018/0199464 A1 | 7/2018 | Lofy et al. |
| 2018/0251008 A1 | 9/2018 | Androulakis et al. |

FOREIGN PATENT DOCUMENTS

| | | |
|---|---|---|
| CN | 101 971 453 | 2/2011 |
| CN | 201 790 354 | 4/2011 |
| DE | 36 39 089 | 5/1988 |
| DE | 40 28 658 | 3/1991 |
| DE | 42 13 564 | 10/1993 |
| DE | 102 38 552 | 8/2001 |
| DE | 101 01 028 | 7/2002 |
| DE | 101 15 242 | 10/2002 |
| GB | 2 390 586 | 1/2004 |
| JP | 05-264152 | 10/1993 |
| JP | 06-207769 | 7/1994 |
| JP | 07-218084 | 8/1995 |
| JP | 10-297243 | 11/1998 |
| JP | 11-098705 | 4/1999 |
| JP | 2001-208465 | 8/2001 |
| JP | 2002-031456 | 1/2002 |
| JP | 2003-078593 | 3/2003 |
| JP | 2003-106728 | 4/2003 |
| JP | 2003-211941 | 7/2003 |
| JP | 2003-254636 | 9/2003 |
| JP | 2003-304977 | 10/2003 |
| JP | 2004-278893 | 10/2004 |
| JP | 2006-102492 | 4/2006 |
| JP | 2008-206295 | 9/2008 |
| JP | 2009-030961 | 2/2009 |
| JP | 2012-044064 | 3/2012 |
| KR | 10-2007-0080057 | 8/2007 |
| WO | WO 02/011968 | 2/2002 |
| WO | WO 02/020292 | 3/2002 |
| WO | WO 03/014634 | 2/2003 |
| WO | WO 03/051666 | 6/2003 |
| WO | WO 2006/064432 | 6/2006 |
| WO | WO 2007/001289 | 1/2007 |
| WO | WO 2007/089789 | 8/2007 |
| WO | WO 2009/036077 | 3/2009 |
| WO | WO 2010/026805 | 3/2010 |
| WO | WO 2010/032689 | 3/2010 |
| WO | WO 2014/008423 | 1/2014 |
| WO | WO 2014/151493 | 9/2014 |
| WO | WO 2015/191819 | 12/2015 |
| WO | WO 2018/152288 | 8/2018 |

OTHER PUBLICATIONS

U.S. Appl. No. 15/536,407, filed Jun. 15, 2017, Androulakis et al.
U.S. Appl. No. 15/263,351, filed Sep. 12, 2016, Lofy et al.
U.S. Appl. No. 15/317,757, filed Dec. 9, 2016, Andrix et al.
Feher, Steve, "Thermoelectric Air Conditioned Variable Temperature Seat (VTS) & Effect Upon Vehicle Occupant Comfort, Vehicle Energy Efficiency, and Vehicle Environment Compatibility", SAE Technical Paper, Apr. 1993, pp. 341-349.
Lofy et al., "Thermoelectrics for Environmental Control in Automobiles", Proceeding of Twenty-First International Conference on Thermoelectrics (ICT 2002), 2002, pp. 471-476.
Photographs and accompanying description of climate control seat assembly system components publicly disclosed as early as Jan. 1998.
Photographs and accompanying description of a component of a climate control seat assembly system sold prior to Nov. 1, 2005.
Photographs and accompanying description of a component of a climate control seat assembly system sold prior to Dec. 20, 2003.
International Search Report and Written Opinion received in PCT Application No. PCT/US2013/049366, dated Dec. 12, 2013.
International Preliminary Report on Patentability received in PCT Application No. PCT/US2013/049366, dated Jan. 15, 2015.
U.S. Appl. No. 15/694,467, filed Sep. 1, 2017, Adldinger et al.

* cited by examiner

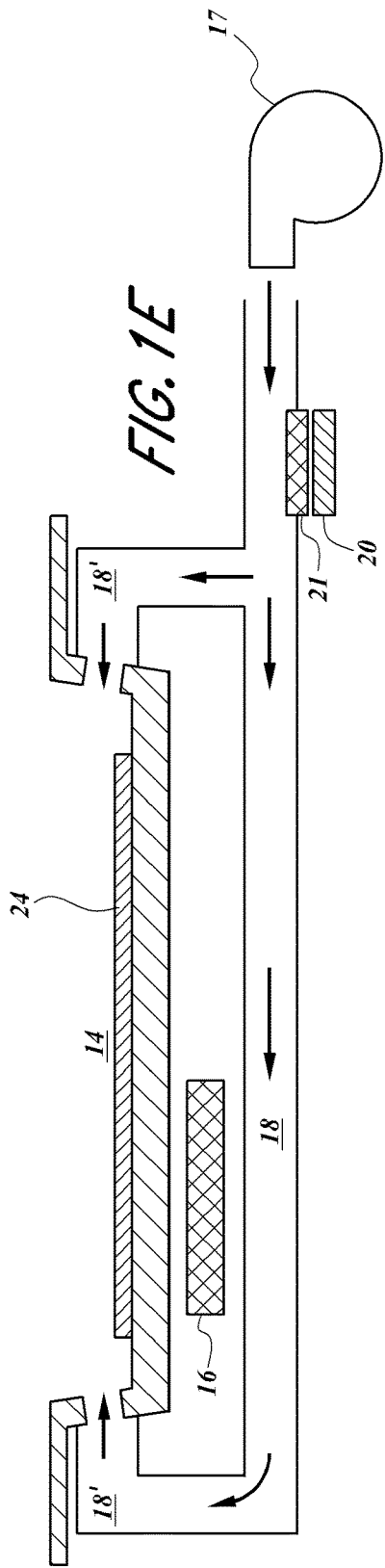
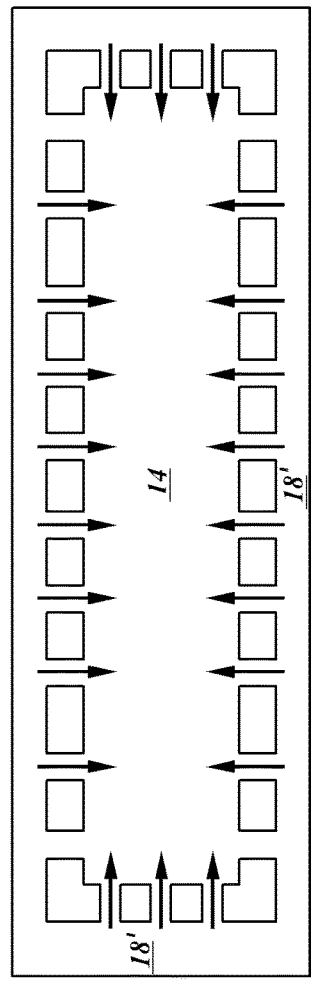
FIG.1E
FIG.1F

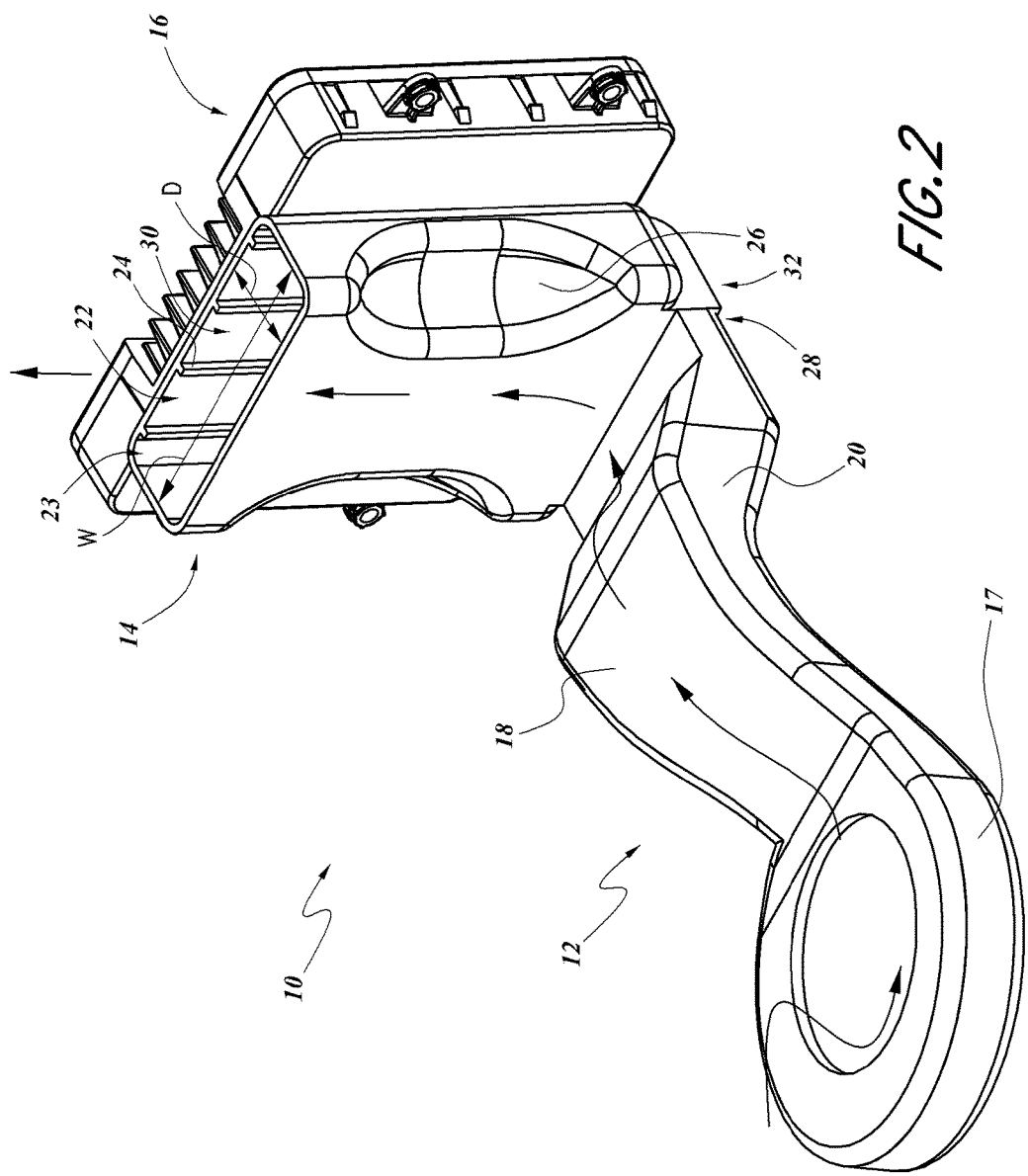

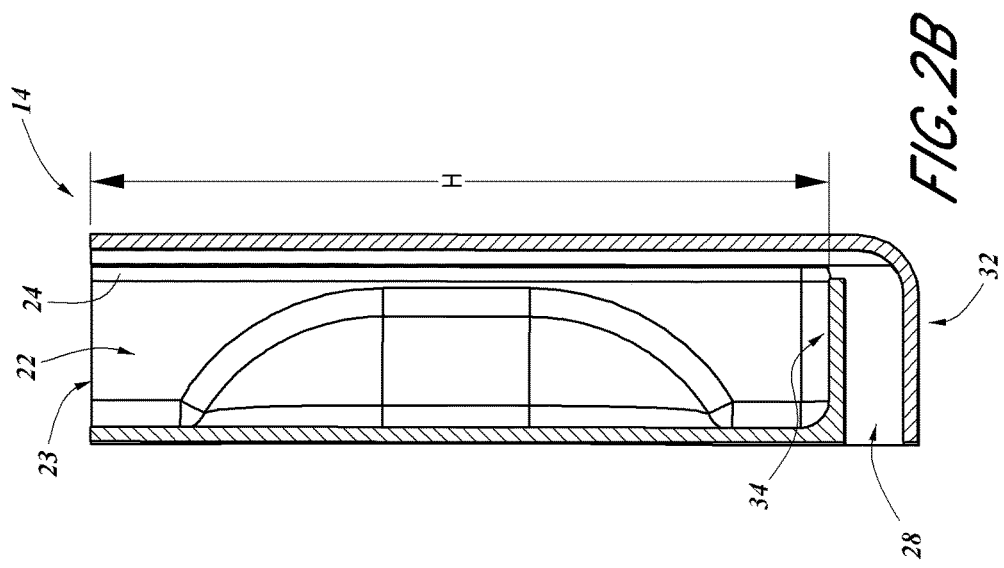
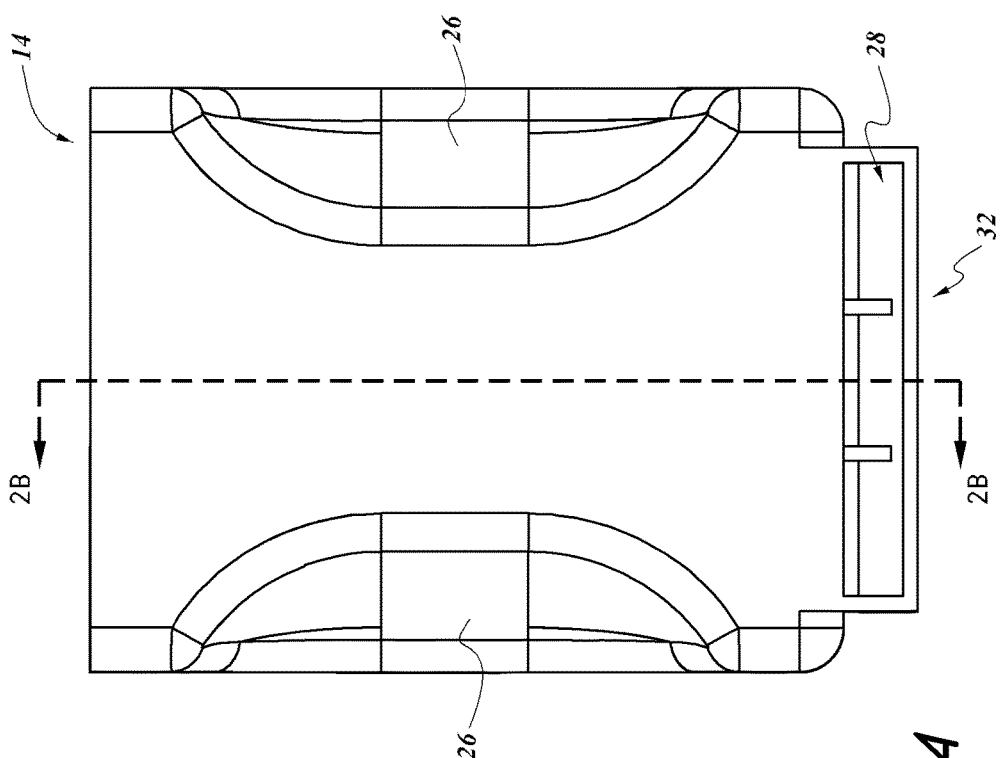

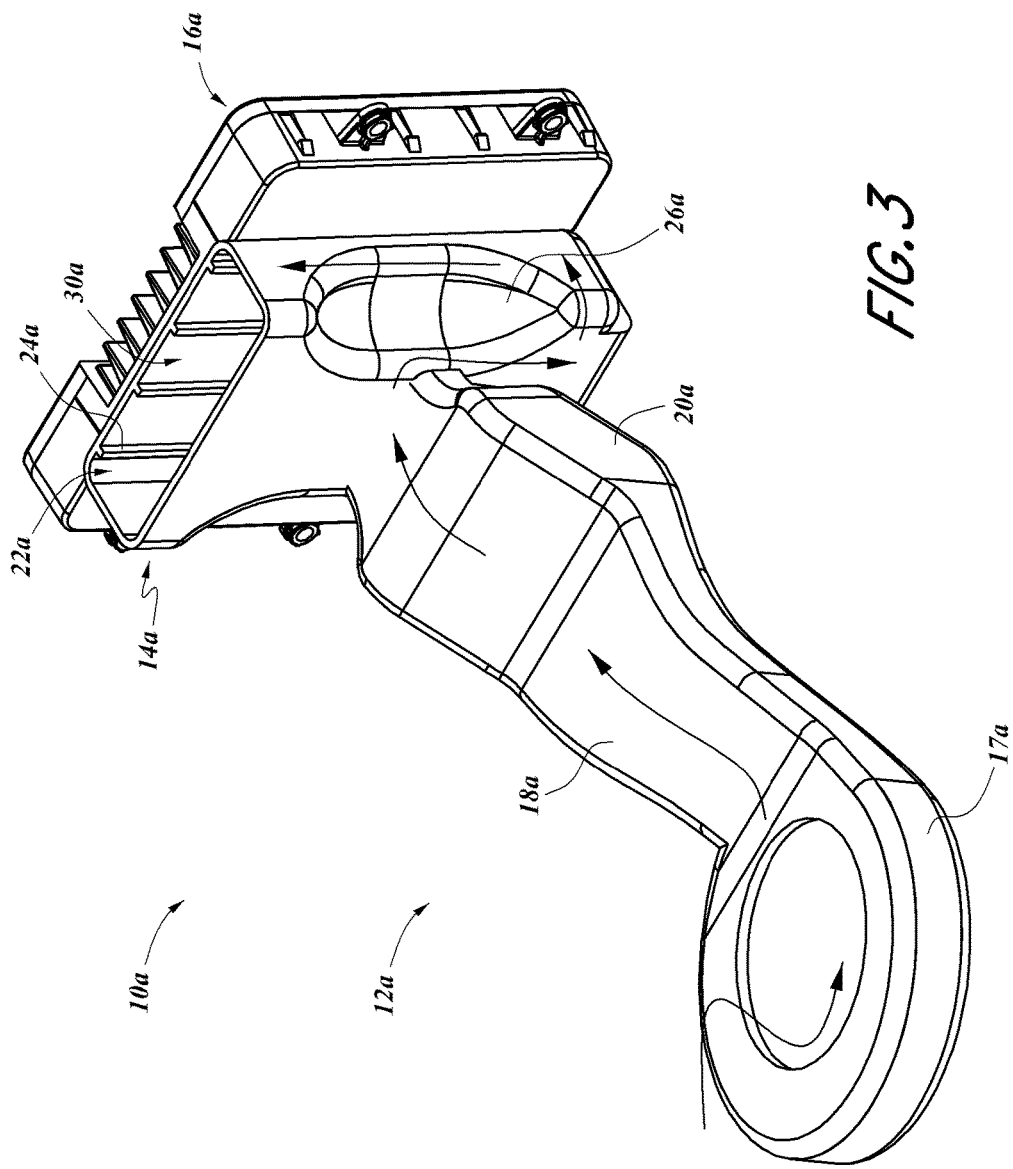

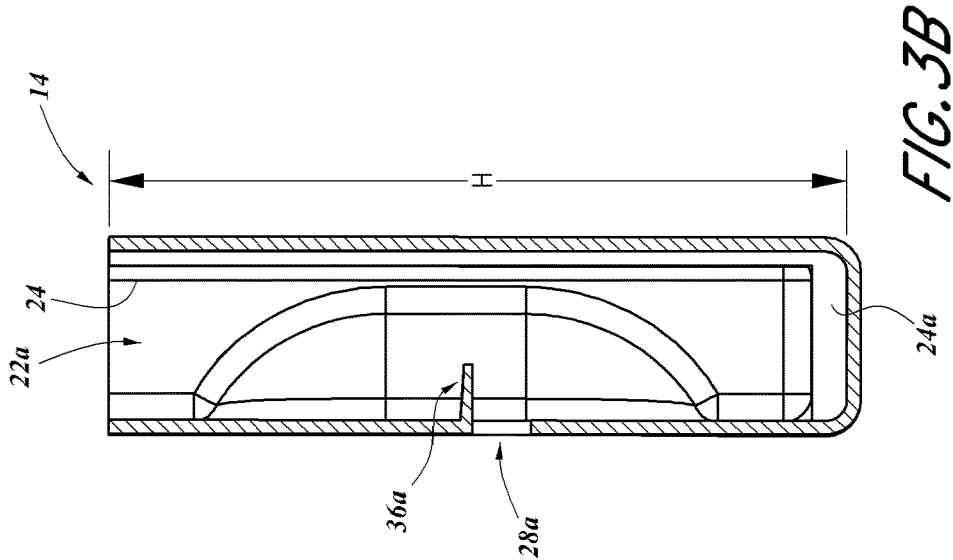
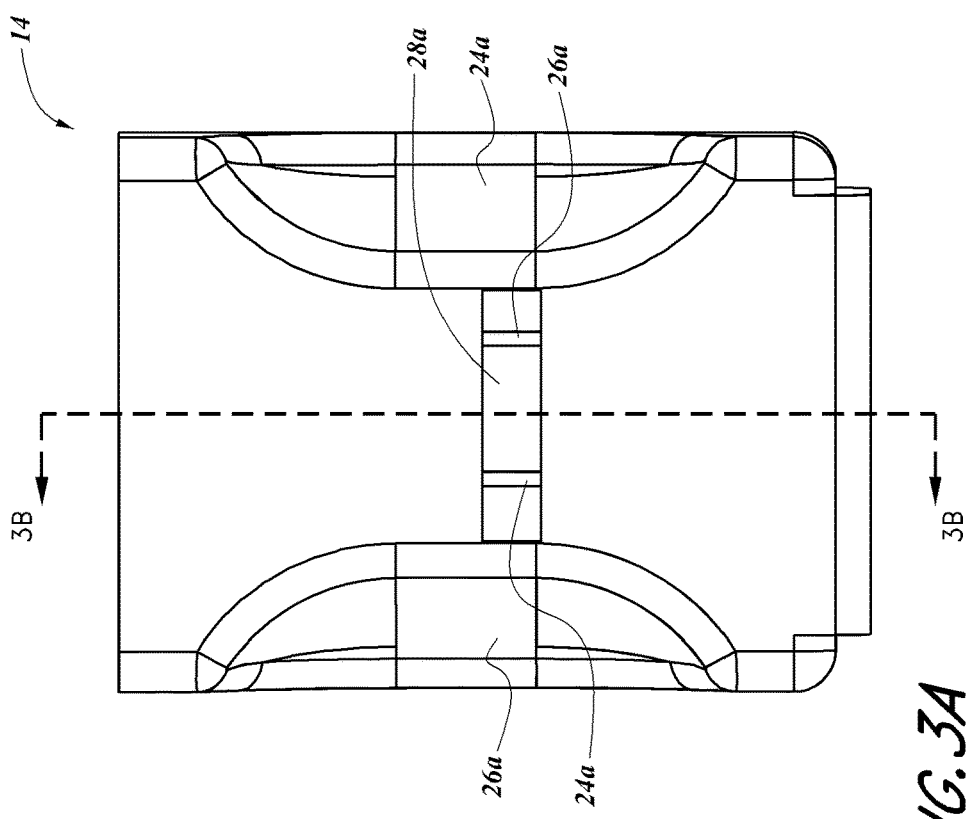

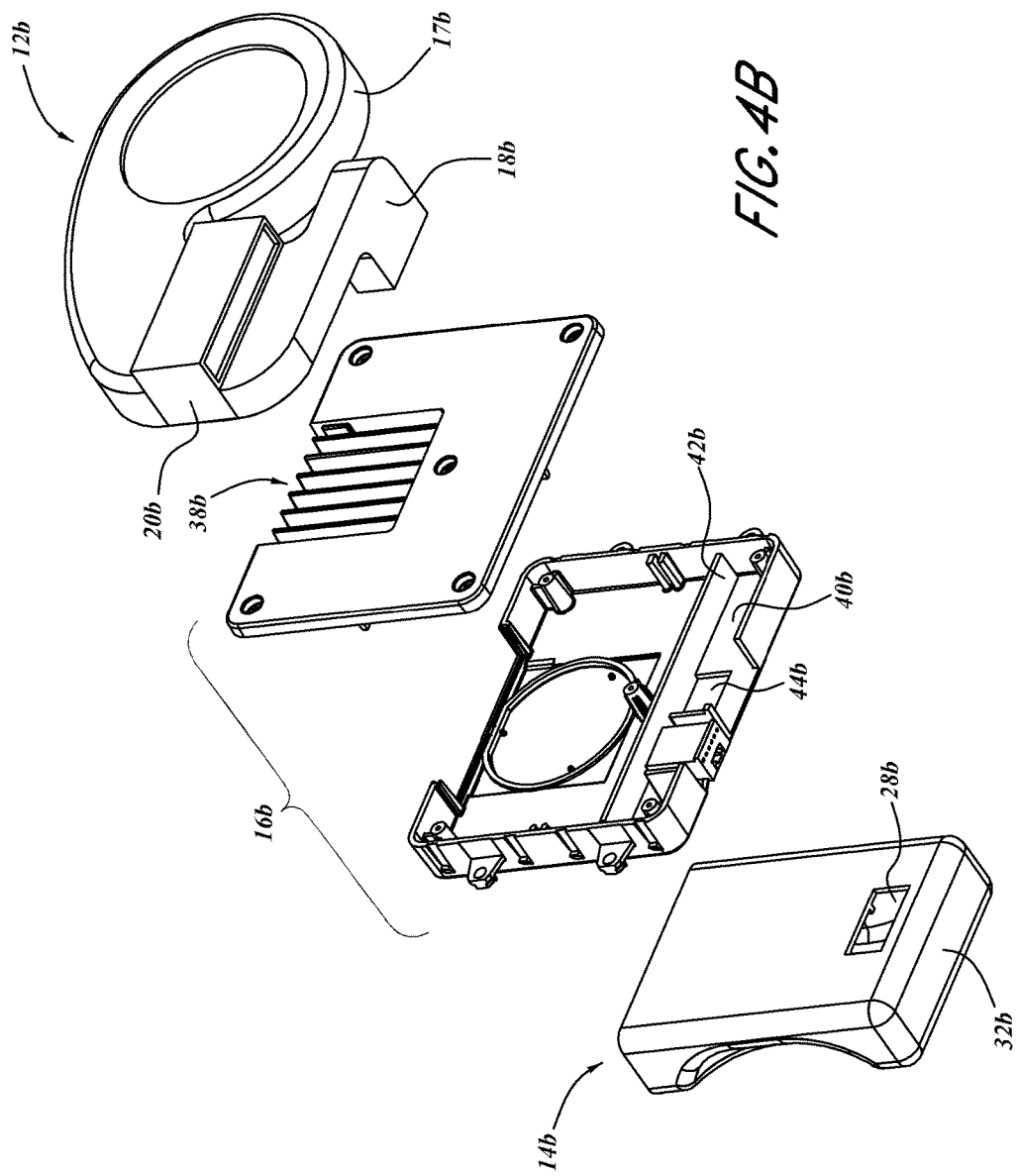

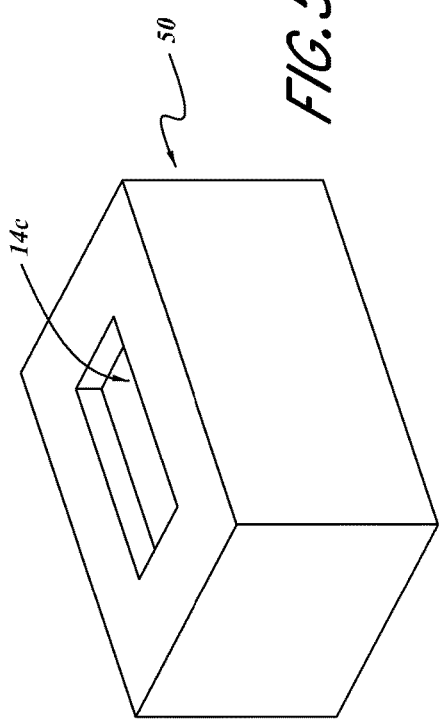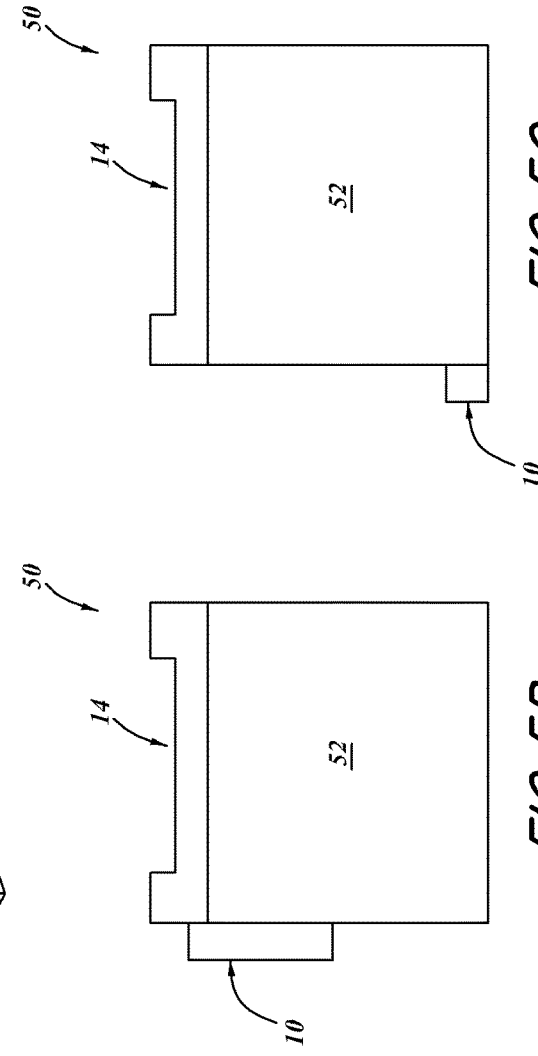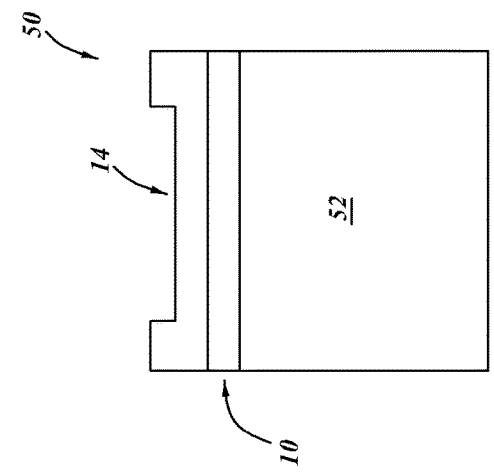

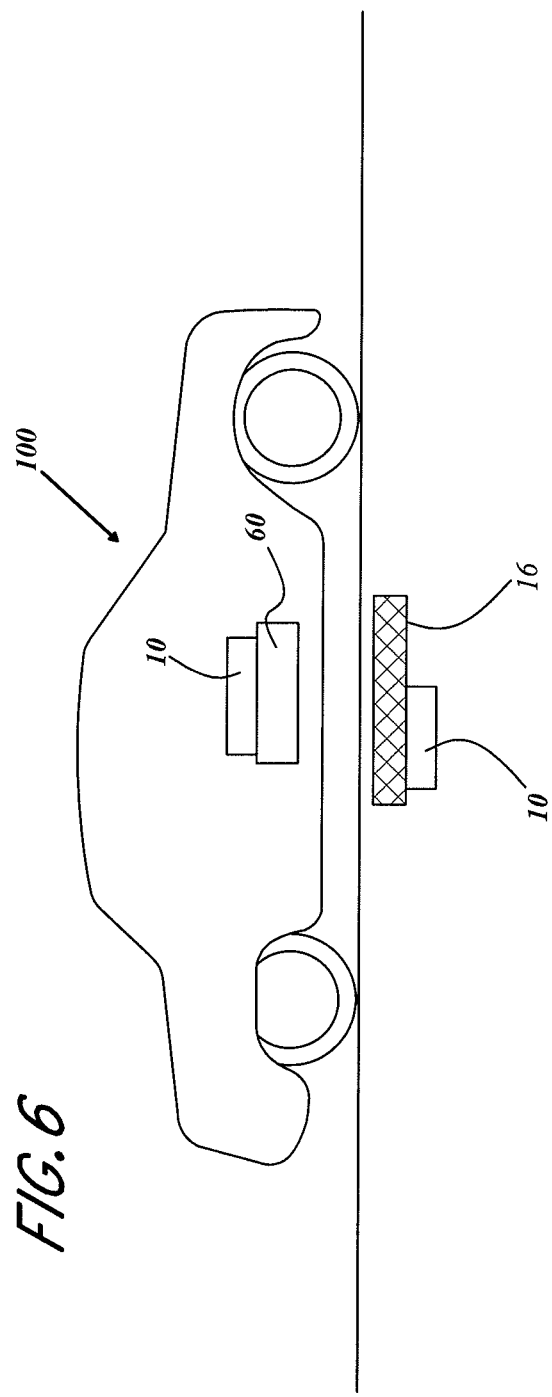

SYSTEMS AND METHODS FOR COOLING INDUCTIVE CHARGING ASSEMBLIES

CROSS-REFERENCE TO RELATED APPLICATIONS

This application is a continuation of U.S. patent application Ser. No. 13/935,321, filed Jul. 3, 2013, which claims the priority benefit under 35 U.S.C. § 119(e) of U.S. Provisional Application No. 61/668,897, filed Jul. 6, 2012, the entirety of each of which is hereby incorporated by reference.

BACKGROUND

Field

This application relates to a cooling device and, in some embodiments, to a thermoelectrically cooled inductive charging station, such as for charging a cell phone or other portable electronic devices, and components thereof.

Description of the Related Art

Portable electronic devices (PEDs), such as cell phones, music players, sound recorders, computers (e.g., laptops, tablets, etc.), radios, watches, and otherwise, generally require power for operation. As such, many PEDs include a rechargeable battery or other rechargeable power source, thereby allowing for the device to be powered and readily transported without being limited by the length of electrical power cords or the like. In some instances, the charging of PEDs is accomplished with a physical electrical connection, such as a plug or other electrical connection that is connected with the device during charging and then disconnected when charging is complete. However, such connections are inconvenient due to the requirement of connecting and disconnecting the physical electrical connection.

Some PEDs avoid the need for such a physical electrical connection by being configured to accept inductive charging. Inductive charging uses electromagnetic fields to transfer power from a base (e.g., a dock) to a receiver (e.g., the power source in the PED) that is in close proximity to the base. Because power is transferred via the electromagnetic fields, a physical electrical connection between the base and the receiver is not required, thus eliminating the inconvenience associated with connecting and disconnecting the physical electrical connection.

SUMMARY OF THE DISCLOSURE

Recently, it has been proposed to provide certain vehicles (e.g., cars, trucks, tractors, airplanes, boats, and otherwise) with an inductive charging assembly for PEDs. Such a design can allow users to place (e.g., insert) their PED in a dock (e.g., a pad, surface, recess, slot, or otherwise) that has inductive charging functionality, thereby providing inductive charging of the PED without the inconvenience associated with connecting and disconnecting an electrical cord. The dock can comprise an open structure. Alternatively, the dock can be at least partially enclosed, as desired or required.

One of the byproducts of inductive charging is heat, which can be unwanted in certain situations. For example, heat generated by inductive charging may place an additional load on the heating, ventilating, and air-conditioning system of the vehicle, which can result in decreased performance and/or reduced fuel economy. Further, heat produced by inductive charging may raise the temperature of the PED, which can degrade the performance of the PED and/or make the PED uncomfortable to use. For example, raising the temperature of a cell phone may make the phone uncomfortable to hold and/or to press against the user's ear. Some PEDs even have thermal limits, which shutdown or hinder the functionality of the PED when the PED becomes too hot.

Accordingly, for various reasons, it can be beneficial to cool the inductive charging assembly and/or the PED. In some embodiments, the inductive charging assembly is cooled by a thermal conditioning module (e.g., thermoelectric device (TED), heat sink, heat pipe, liquid loop, refrigeration circuit, swamp cooler, phase change material, or other type of cooling device), which has a hot side (also known as the waste side) and a cold side (also known as the main side). A waste side heat exchanger can be thermally coupled to the hot side of the TED. Certain embodiments include a conduction member (e.g., a plate, barrier, film, spacer, or otherwise) configured to promote conductive heat transfer from the cool side to the inductive charging station or the PED. Some embodiments include a fluid transfer device (e.g., a blower, pump, fan, etc.), which can selectively provide a fluid flow (e.g., a flow of air or another fluid). Certain embodiments are configured such that the fluid flow can promote convective heat transfer from the inductive charging station and/or the PED. In some implementations, the conduction member promotes conductive heat transfer from the inductive charging assembly and/or the PED to the cold side. In some embodiments, air exits the hot side of the thermal conditioning module into a space in which the thermal conditioning module resides. In other embodiments, air exits the hot side of the thermal conditioning module and is routed (e.g., through ducting) elsewhere, such as to the ambient environment or to outside a vehicle in which the system is located.

In some embodiments, a cooling system for an inductive charger includes a thermal conditioning assembly in fluid communication with an inductive charging assembly. The inductive charging assembly can be configured to partly or fully receive a PED, such as a cell phone, music player, sound recorder, computer (e.g., laptop or tablet), radio, watch, navigational aid, and otherwise. The inductive charging assembly can be configured to provide inductive charging to the PED. As a result and/or byproduct of the inductive charging, heat can be produced.

Certain implementations of thermal conditioning assembly include one or more of the following: a fluid transfer device, a thermal conditioning module, and a heat exchanger. In some implementations, ducting (e.g., piping, tubing, or other another structure that conveys fluid) fluidly connects at least two of the following: the fluid transfer device, the thermal conditioning module, and the inductive charging assembly.

In some variants, the fluid transfer device is configured to produce an air flow through the ducting. In some implementations, the fluid transfer device is configured to produce a liquid flow through the ducting. In some embodiments the thermal conditioning module is in conductive thermal communication with the inductive charging assembly and/or the heat exchanger. In some implementations, the heat exchanger is in convective thermal communication with the air or liquid flow. In some variants, the heat from the inductive charging is transferred to the air or liquid flow by conductive heat transfer from the inductive charging assembly to the heat exchanger via the thermal conditioning module and/or by convective heat transfer from the heat exchanger to the air flow.

In some implementations, the cooling system includes the inductive charging assembly. In some embodiments, the inductive charging assembly includes a dock, such as a pad, recess, slot, or otherwise. In some embodiments, the inductive charging assembly includes an inductive charging module, such as an inductive coil or circuit. In certain embodiments, the cooling system includes the PED. In several variants, the thermal conditioning module includes a thermoelectric device.

In some implementations, the system includes a conduction member (e.g., a plate, barrier, film, spacer, heat pipe, or otherwise). Some embodiments of the conduction member are positioned between the inductive charging assembly and the thermal conditioning module. In some implementations, the conduction member has a first portion and a second portion. Some variants of the first portion are configured to partly or completely shield the thermal conditioning module from an electromagnetic field produced by the inductive charging assembly (e.g., by blocking and/or absorbing the field). Some variants of the second portion have a portion configured to partly or completely not shield (e.g. not block and/or absorb) the electromagnetic field produced by the inductive charging assembly. For example, the second portion can include an aperture configured to generally allow passage of the electromagnetic field.

In various embodiments, the ducting connects with a bottom of the dock, thereby providing fluid (e.g., air) to the bottom of the dock. In some embodiments, the fluid can flow toward the top (e.g., an upper or uppermost portion) of the dock along at least a portion of the PED device. In certain implementations, the ducting connects with a middle portion the dock, and the fluid is directed toward the bottom (e.g., a lower or lowest portion) of the dock before flowing toward the top of the dock along at least a portion of the PED.

In some embodiments, a cooling system for an inductive charger includes a thermal conditioning assembly in fluid communication with an inductive charging assembly. The inductive charging assembly can be configured to receive a PED. The inductive charging assembly can be configured to provide inductive charging to the PED, the inductive charging producing heat. The thermal conditioning assembly can include a fluid transfer device, a thermal conditioning module, and a heat exchanger. In some implementations, ducting fluidly connects the fluid transfer device, thermal conditioning module, and inductive charging assembly.

The fluid transfer device can be configured to produce an air flow through the ducting. The air flow can pass across (e.g., along, over, through, around, etc.) the heat exchanger. In some embodiments, an amount of heat from the air flow is transferred to the thermal conditioning device via the heat exchanger, thereby producing a cooled air flow. The cooled air flow can be provided to the inductive charging assembly. The heat from the inductive charging can be transferred to the cooled air flow. In some embodiments, at least a portion of the heat generated by the inductive charging is offset (e.g., dissipated, counteracted, negated, or the like).

According to some variants, a method of cooling an inductive charging assembly in a vehicle includes drawing air into a fluid transfer device and providing (e.g., via ducting) the air to a thermal conditioning device. The method can also include reducing the temperature of the air with the thermal conditioning device. Some embodiments of the method include providing the air to a dock. The dock can include a cavity (e.g., an interior) configured to partly or completely receive a PED. Some variants of the dock are positioned adjacent (e.g., near, in the vicinity of, immediately next to, or otherwise) to an inductive charging module. The inductive charging module can be configured to provide inductive charging to the PED in the dock. In some embodiments, the method includes passing the air along a channel of the dock and/or along at least along a portion of the PED. For example, the air can be passed along a longitudinal length of the PED. Certain implementations of the method include increasing the temperature of the air with heat generated by the inductive charging of the PED. The method can also include expelling the air into the ambient (e.g., an interior of a vehicle in which the system is located).

Some embodiments of the method also include securing the PED (e.g., by inhibiting movement, vibration, and/or unintentional removal of the PED from the dock). For example, one or more ribs can be used to secure the PED. In some variants, the channel is partially defined by the ribs, which can extend into a cavity (e.g., void or chamber) of the dock.

Certain embodiments of the method include providing the air to a bottom (e.g., lower or lowermost portion) of the dock. Some embodiments of the method include providing the air to a middle portion (e.g., a portion between the top and bottom of the dock, a portion at the longitudinal midpoint of the height of the dock, etc.) of the dock. In certain implementations, the method includes providing the air to the inductive charging module prior to providing the air to the dock.

In some implementations, a method of cooling a dock in preparation for receiving a PED in the dock includes receiving a signal from the PED. For example, the PED may wirelessly send a signal. Some implementations also include determining, based on the signal, whether cooling of the dock is desired. For example, the signal may indicate the position of the PED (e.g., relative to the dock) and/or the temperature of the PED. The method can also include activating a thermal conditioning module to produce a cold side of the thermal conditioning module. Some embodiments include encouraging an air flow with a fluid transfer device. The method can further include passing the air flow through ducting and across a heat exchanger. In some embodiments the method includes transferring heat from the dock to the air flow.

In some variants, transferring heat from the dock to the air flow includes conductively transferring heat from the dock to the cold side of the thermal conditioning module and/or from the thermal conditioning module to a heat exchanger. In some variants, the transferring heat from the dock to the air flow includes convectively transferring the heat from the heat exchanger to the air flow.

In some embodiments, transferring heat from the dock to the air flow includes transferring heat from the air flow to the cold side of the thermal conditioning module to produce a cooled air flow. The method can also include providing the cooled air flow to the dock. Some embodiments include transferring heat from the dock to the cooled air flow.

According to some embodiments, a method of inhibiting thermal shutdown of a PED includes detecting a temperature of a dock configured to receive the PED. The method can also include determining, based on the detected temperature, whether a PED placed into the dock would be in danger of thermal shutdown. For example, in some embodiments, a dock having a temperature of greater than or equal to about 60° C. may present an increased risk of causing the PED to shut down. Some embodiments of the method include activating a thermal conditioning module to produce a cold side of the thermal conditioning module. Certain embodiments include encouraging an air flow with a fluid transfer device. In some variants, the method includes passing the air flow through ducting and across a heat exchanger and transferring heat from the dock to the air flow.

In some embodiments, a thermally conditioned inductive charging system includes a dock having a portion (e.g., an interior), which can be configured to receive a portable electronic device. The system can also include a thermal conditioning assembly. The dock can be positioned adjacent an inductive charging module such that the portable electronic device received in the dock can be selectively inductively charged. In certain implementations, the thermal conditioning assembly is configured to selectively cool the portion of the dock.

In several embodiments, the thermal conditioning assembly also has a thermal conditioning module. Certain variants of the thermal conditioning module are configured to conductively cool the portion of the dock. Some variants of the thermal conditioning assembly also include a fluid transfer device configured to produce a fluid flow. The thermal conditioning module can be configured to cool the fluid flow and the cooled fluid flow can convectively cool the portion of the dock. In some embodiments, the thermal conditioning module is a thermoelectric device.

According to some embodiments, a cooling system for an inductive charger includes a thermal conditioning assembly, which can be in fluid communication with an inductive charging assembly. The inductive charging assembly can have a dock and an inductive charging module. The dock can include an interior that is configured to receive a portable electronic device. The inductive charging module can be configured to provide inductive charging to the portable electronic device. In some variants, the thermal conditioning assembly includes a fluid transfer device that is configured to produce a fluid flow. The fluid flow can be delivered to the interior of the dock, thereby cooling the portable electronic device.

In some implementations, the thermal conditioning assembly also includes a thermal conditioning module. Some variants of the thermal conditioning module are configured to cool the fluid flow. In certain embodiments, the thermal conditioning module is configured to cool a conduction member in conductive thermal communication with the dock. In some embodiments, the thermal conditioning module is configured to cool the fluid flow. For example, the fluid flow can be cooled prior to being delivered to the interior of the dock. In some embodiments, the thermal conditioning module comprises a thermoelectric device. Some implementations include ducting that fluidly connects the fluid transfer device and the thermal conditioning module.

Certain embodiments of the system include the inductive charging assembly. Other embodiments of the system do not include the inductive charging assembly. In some variants, the system is at least partly integrated into an automobile (e.g., a car or truck). For example, the dock can be integrated into a dashboard, console, armrest or other portion of the automobile. In some implementations, the portable electronic device comprises a cell phone. In some embodiments, the portable electronic device comprises a battery (e.g., a cell phone battery, camera battery, computer battery, or otherwise). In some variants, the portable electronic device comprises a tablet or laptop computer. In various embodiments, the heat from a waste side of the thermal conditioning module is convectively transferred away from the thermal conditioning module.

In some embodiments, a cooled inductive charging system includes a thermal conditioning assembly and a charging assembly. The charging assembly can be operatively integrated with the thermal conditioning assembly. The thermal conditioning assembly can be configured to provide a flow of air to selectively cool the charging assembly. In some embodiments, the charging assembly is configured to selectively charge a portable electronic device. In certain variants, the thermal conditioning assembly is further configured to selectively cool the portable electronic device. In some implementations, the thermal conditioning assembly includes a fluid transfer device configured to provide the flow of air and/or a thermoelectric device configured to cool the flow of air. In some embodiments, the thermal conditioning assembly includes a thermal conditioning module configured to conductively cool the portable electronic device.

In certain implementations, a method of cooling an inductive charging assembly in a vehicle includes drawing air into a fluid transfer device and providing the air to a dock. The dock can include a cavity that is configured to receive a portable electronic device. The dock can be positioned adjacent to an inductive charging module that is configured to provide inductive charging to the portable electronic device received in the dock. The method can also include passing the air along a channel in the cavity of the dock and at least along a portion of the portable electronic device. In certain embodiments, the method includes cooling the portable electronic device with the air, such as by convection. In some implementations, the method includes expelling the air into the ambient interior of the vehicle.

In certain embodiments, the method also includes providing the air to a thermal conditioning module configured to cool the air. For example, the air can be provided to the bottom of the dock. As another example, the air can be provided to a middle portion of the dock. In some embodiments, the method includes providing the air to the inductive charging module prior to providing the air to the dock. In some embodiments, the method includes providing the air to the inductive charging module substantially simultaneous with providing the air to the dock. In some variants, the channel is partially defined by ribs. For example, ribs that extend into the cavity.

According to some embodiments, a method of cooling a dock in preparation for receiving a portable electronic device in the dock includes receiving a signal from the portable electronic device and encouraging an air flow with a fluid transfer device. Some implementations also include delivering the air flow to the dock and conditioning the dock. In certain variants, the method can also include determining, based on the signal, whether cooling of the dock is desired. Some embodiments of the method also include passing the air flow through ducting and across a heat exchanger. In some implementations, conditioning the dock includes conductively transferring heat from the dock to a thermal conditioning module. In certain embodiments, conditioning the dock includes, prior to delivering the air to the dock, transferring heat from the air flow to a thermal conditioning module. In some variants, receiving a signal from the portable electronic device includes receiving a signal indicating a proximity of the portable electronic device to the dock.

Some embodiments of a method of inhibiting thermal shutdown of a portable electronic device include detecting a temperature of a dock that is configured to receive the portable electronic device and encouraging an air flow with a fluid transfer device. The method can further include conditioning the dock. In some implementations, the method includes passing the air flow through ducting and across a heat exchanger. Certain embodiments of the method also include determining, based on the detected temperature, whether a portable electronic device placed into the dock would be in danger of thermal shutdown. In some implementations, conditioning the dock includes conductively transferring heat from the dock to a thermal conditioning module. In some embodiments, conditioning the dock comprises providing the air flow to the dock. In several variants, the method includes, prior to providing the air flow to the dock, cooling the air flow with a thermal conditioning module, such as a thermoelectric device.

BRIEF DESCRIPTION OF THE DRAWINGS

FIG. 1E schematically illustrates a fourth embodiment of the system of FIG. 1, the embodiment including a dock and a cooling channel.

FIG. 1F illustrates a top view of the dock and cooling channel of FIG. 1E.

FIG. 2 illustrates a perspective view of an embodiment of a cooling system for an inductive charger with a thermal conditioning module connected with a dock.

FIG. 2A illustrates a front view of the dock of FIG. 2.

FIG. 2B illustrates a cross-sectional view of the dock of FIG. 2A taken along the line 2B-2B.

FIG. 3 illustrates a perspective view of another embodiment of a cooling system for an inductive charger with a thermal conditioning module connected with a dock.

FIG. 3A illustrates a front view of the dock of FIG. 3.

FIG. 3B illustrates a cross-sectional view of the dock of FIG. 3A taken along the line 3B-3B.

FIG. 4B illustrates an exploded bottom perspective view of the cooling system of FIG. 4A.

FIG. 5 illustrates an embodiment of a console with a dock cooled by a cooling system.

FIG. 5A schematically illustrates a first configuration of the console of FIG. 5.

FIG. 5B schematically illustrates a second configuration of the console of FIG. 5.

FIG. 5C schematically illustrates a third configuration of the console of FIG. 5.

FIG. 6 illustrates an embodiment of a cooling system for a vehicle inductive changing system.

DETAILED DESCRIPTION

Figure 1:
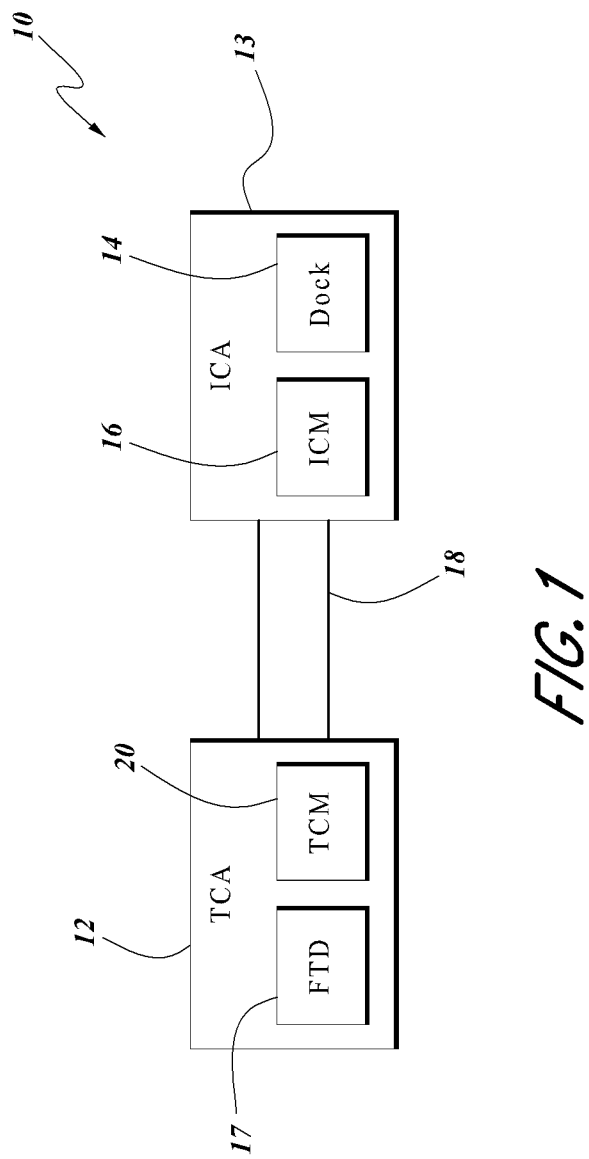
FIG. 1 schematically illustrates a system for cooling an inductive charger.

With reference to FIG. 1, a system 10 for cooling an inductive charger is illustrated. In some embodiments, the system 10 includes a thermal conditioning assembly 12 in thermal communication with an inductive charging assembly 13. In various implementations, the system 10 is located in a vehicle, such as a car, truck, tractor, airplane, ship, train, motorcycle, wheelchair, stroller, wagon, or otherwise. In some embodiments, the system is incorporated, at least partially, into one or more other components of the vehicle (e.g., console, dashboard, other interior portion, etc.). Some variants of the system 10 are included in a generally stationary object, such as a chair, bed, desk, table, or otherwise.

In certain implementations, the thermal conditioning assembly 12 includes one more of the following: a fluid transfer device 17 (such as, e.g., a pump, blower, or fan), ducting 18 (e.g., a fluid line, coupling, piping, tubing, etc.) thermal conditioning module 20 (e.g., thermoelectric devices (TEDs), conductive heat transfer devices, refrigeration device, ventilation device that uses no active cooling, other cooling or ventilation devices, etc.), sensors (e.g., temperature sensors, humidity sensors, condensation sensors, etc.), timers and/or the like. As used herein, the term thermal conditioning module has the same meaning as the term thermal conditioning device, which has the same meaning as the term thermal module. In some embodiments, the thermal conditioning assembly 12 comprises a fluid transfer device 17 and no active cooling components or features.

Certain implementations of the inductive charging assembly 13 include a dock 14 and/or an inductive charging module 16. In various embodiments, the dock 14 is a space configured to support, hold, and/or receive some or all of a PED (e.g., a smartphone, other mobile phone, music playing device, laptop or tablet computer, personal digital assistant (PDAs), navigational aid, etc.). For example, the dock 14 can be a pad, recess, slot, opening, and/or otherwise. In some embodiments, the dock comprises a generally open structure (e.g., without any enclosed or partially enclosed spaced), such as a planar surface. In other embodiments, the dock is at least partially enclosed and comprises an interior space. In some implementations, the dock 14 includes padding or other shock and/or vibration dampening structures. The inductive charging module can be integrated into the assembly or can be separate and district from it, as desired or required.

The inductive charging module 16 can be configured to provide inductive charging functionality to a PED that is configured to accept inductive charging and is placed in and/or on the dock 14. For example, the inductive charging module 16 can be configured to generate an electromagnetic field to transfer power to a PED mounted in the dock 14. Certain variants of the inductive charging module 16 (e.g., an inductive coil, circuit, or otherwise) are positioned in, on, adjacent, or near the dock 14. In some embodiments, the inductive charging module 16 can receive electrical power from an electrical system, such as a power bus, battery, or otherwise.

Figure 1B:
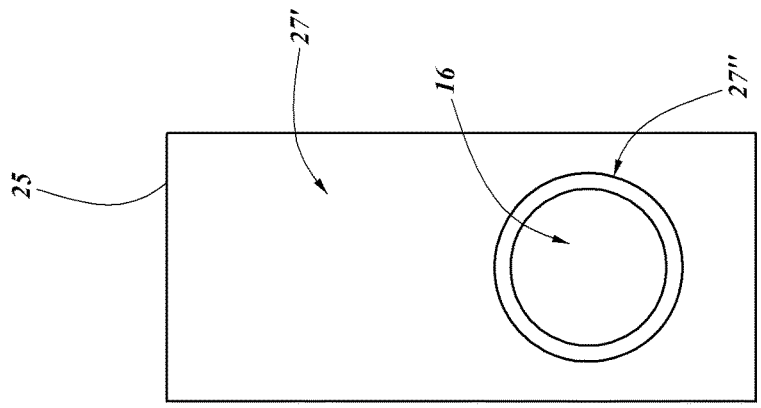
FIG. 1B illustrates a front view of the conduction member of FIG. 1A.
Figure 1A:
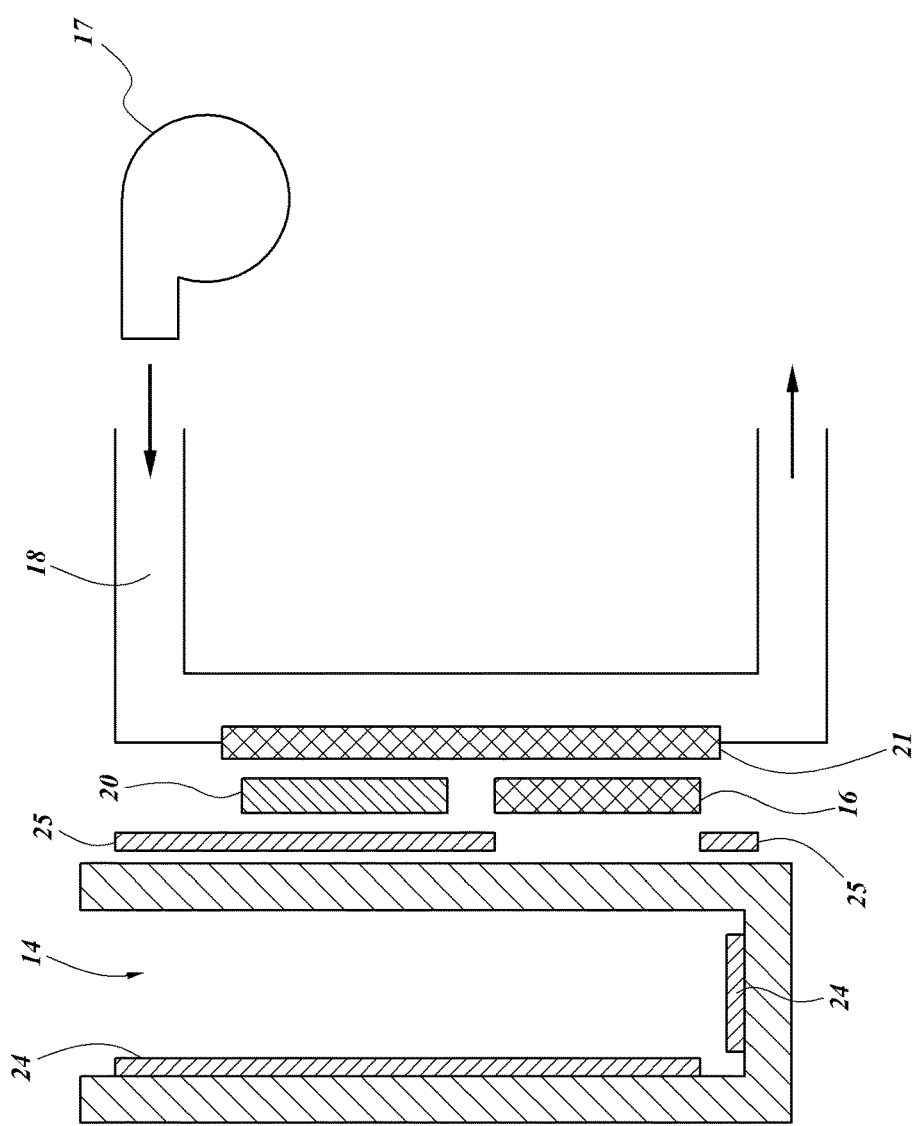
FIG. 1A schematically illustrates a first embodiment of the system of FIG. 1, the embodiment including a conduction member.

As illustrated in FIG. 1A, the thermal conditioning assembly 12 can include various types of fluid transfer devices 17, such as fans, blowers, pumps, or the like. For example, some embodiments of the fluid transfer device 17 include a radial fan (e.g., squirrel cage fan), axial fan, propeller fan, and/or the like. In certain embodiments, the fluid transfer device 17 is configured to draw air from near a floor or lower portion of the vehicle, which can be beneficial because such air may be cooler than air originating from other locations of the vehicle (e.g., due to a reduction in solar loading or otherwise). However, in some embodiments, the thermal conditioning assembly does not include any blowers or other fluid transfer devices.

Some embodiments include ducting 18 (e.g., duct, coupling, or other fluid passage) that is in fluid communication with the fluid transfer device 17. The ducting 18 can also be in fluid communication with a thermal conditioning module 20 (e.g., TED), the dock 14, one or more sensors, and/or any other components or devices, as desired or required. In some variants, the ducting 18 is in fluid communication with the dock 14 via an opening 28 (see, e.g., FIGS. 2 and 2B) in the dock 14. Certain implementations of the thermal conditioning assembly 12 include the fluid transfer device 17 and thermal conditioning module 20 in a single housing. For example, in some embodiments, the fluid transfer device 17 is connected with the thermal conditioning module 20 without ducting 18. However, in alternative embodiments, one or more components can be included in separate (e.g., adjacent or non-adjacent) housing or casings.

As noted above, the thermal conditioning module 20 can comprise a TED, such as a Peltier device. In some embodiments, the TED includes at least one pair of dissimilar materials (e.g., a series of n-type and p-type semiconductor elements) that are connected electrically in series and thermally in parallel. An electrical circuit can be configured to pass current through the dissimilar materials so as to selectively create a cooled side and an oppositely oriented heated side, depending on the direction of electrical current passing through the TED. In some embodiments, the dissimilar materials are mounted between a pair of plates positioned on the cold and hot sides of the TED. The plates can provide for heat conduction and electrical insulation.

A heat exchanger 21, which can include fins or the like, can be conductively coupled to the TED. In certain implementations, the heat exchanger 21 is conductively coupled with the hot (waste) side of the TED. In some embodiments, fluid (e.g., air) from the fluid transfer device 17 can be passed over the heat exchanger 21 to transfer waste heat away from the heat exchanger 21 by convection. In other embodiments, liquid in a liquid loop is passed over the heat exchanger 21 and carries heat away from the heat exchanger 21. In some alternate embodiments, as discussed in more detail below, fluid can be convectively cooled across a cold side plate of the heat exchanger 21 then routed toward the dock 14 so as to cool the dock 14 (and/or from a PED located therein).

With continued reference to FIG. 1A, certain implementations of the thermal conditioning assembly 12 include a conduction member 25 (e.g., a plate, barrier, film, spacer, or otherwise) that is configured to facilitate conductive heat transfer between the dock 14 and other components of the assembly 12, such as the thermal conditioning module 20. For example, the conduction member 25 can be positioned between the thermal conditioning module 20 and the dock 14. In certain variants, the conduction member 25 is made of a thermally-conductive material, such as metal (e.g., aluminum, copper, steel, or otherwise), plastic (e.g., conductive plastic), and/or the like. Certain implementations of the conduction member 25 are made of a metalized plastic, such as metalized polyester, metalized polyethylene, metalized biaxially-oriented polyethylene terephthalate (commercially available under the trade name Mylar®), and otherwise. Some variants are metallized with aluminum, gold, indium tin oxide, or otherwise.

In some embodiments, the conduction member 25 is configured to reduce the potential for interference due to the electromagnetic field produced by the inductive charging module 16. For example, as shown in FIG. 1B, the conduction member 25 can include a first portion 27' that is configured to shield the thermal conditioning module 20 from some or all of the electromagnetic field produced by the inductive charging module 16. In some variants, the first portion 27' is configured to partly, substantially, or completely block or absorb the electromagnetic field to which the thermal conditioning module 20 would otherwise be exposed.

However, because electromagnetic communication (e.g., passage of the electromagnetic field) between the inductive charging module 16 and the dock 14 and/or PED can be important for wirelessly transferring power, certain variants of the conduction member 25 comprise a second portion 27" that is configured to allow such communication. For example the second portion 27" can include a window, recess, slot, or otherwise. The second portion 27" (e.g., window) can be configured to partly or completely align with at least some of the inductive charging module 16. In various implementations, the first portion 27' does not block or absorb the electromagnetic field that passes through the second portion 27". Because it can be beneficial to position the battery (or other component that wirelessly receives the power) of the PED with the second portion 27" to facilitate the power transfer, some embodiments of the dock 14 include one or more orientation features. For example, the dock 14 can include a shape or other indicia indicating to a user the recommended orientation of the battery for the power transfer.

In some embodiments, the first portion 27' comprises or is made of a material that generally or completely blocks or absorbs the electromagnetic field from the inductive charging module 16, such as a metal (e.g., steel, aluminum, copper, or otherwise), metalized plastic, or otherwise. In some embodiments, the second portion 27" is made of a material that generally allows passage of (e.g., does not block or absorb) the electromagnetic field produced by the inductive charging module 16, such as certain plastics and fabrics. In some embodiments, the second portion 27" comprises an area in which the material of the first portion 27' is not present (e.g., has been removed or was not included in the formation of the first portion 27'). In various implementations, the first portion 27' and/or the second portion 27" are configured to facilitate conductive heat transfer between the thermal conditioning module 20 and the dock 14.

In some embodiments, a controller (not shown) controls the operation of the thermal conditioning assembly 12. For example, the controller can allow the user to regulate when the thermal conditioning assembly 12 is activated and deactivated. In some embodiments, the controller receives an input from a sensor (e.g., a temperature sensor, a humidity sensor, a condensation sensor, a device detection sensor, etc.), which can be used in a control algorithm that helps regulate the operation (e.g., on or off, duty cycle, etc.) of the thermal conditioning module 20 (e.g., TED). Such an algorithm can be configured to provide for a desired cooling effect for the module, for fault protection, safety reasons, and/or the like.

In certain variants, the controller is configured to communicate with, or receive signals from, other systems of the vehicle. For example, the controller can be in data communication with a signal that is indicative of whether the vehicle is in operation (e.g., the ignition has been activated), an occupant is positioned in the vehicle, and/or the like. Thus, in some such embodiments, the controller can be configured to allow the thermal conditioning module 20 to operate only if certain conditions are met (e.g., the vehicle is operating, an occupant is positioned in an adjacent seat, temperature/humidity levels are within a specific range, etc.). Electrical power from the vehicle's electrical system can be provided to the controller, fluid transfer device 17 (e.g., fan or blower), TED or other thermal conditioning module 20, sensors, and/or any other components via electrical wires and/or some other direct or indirect electrical connection (not shown). In various embodiments, the controller can receive a signal from a sensor, such as a sensor configured to determine the temperature of the dock 14.

Various embodiments of the system 10 can be configured to advantageously cool (e.g., transfer heat away from) the dock, and thus a PED positioned therein or thereon. In several embodiments, the system 10 is configured to cool (transfer heat from) the dock 14 and/or from a PED in the dock 14. Certain embodiments of the system 10 are additionally or alternatively configured to cool other heat generating components. For example, the system 10 can additionally or alternatively be configured to cool an entertainment system (e.g., radio, CD player, DVD player, and the like), navigation system, climate control (HVAC) system, and/or otherwise. In vehicles, because the inductive charging module 16 and other electrical components are often grouped together (such as in a dashboard, console, armrest, or otherwise), certain embodiments of the system 10 can beneficially provide cooling to one or more of those components.

As shown in FIG. 1A, some embodiments of the system 10 can be configured for heat transfer via conduction. The dock 14 can be in conductive thermal communication with the conduction member 25, which in turn can be in conductive thermal communication with the cold side of the thermal conditioning module 20. In some variants, the dock 14 and/or a PED in the dock 14 can be cooled by conductively transferring heat to the cold side of the thermal conditioning module 20. In some implementations, the heat is conducted via the conduction member 25.

In some embodiments, the fluid transfer device 17 can encourage a flow of fluid (e.g., air) through the ducting 18, which can be in fluid communication with the heat exchanger 21. The hot side of the thermal conditioning module 20 can be in convective thermal communication with the fluid passing through the ducting 18. Thus, the hot side of the thermal conditioning module 20 can be cooled by convectively transferring heat from the heat exchanger 21 to the fluid. The heat can then be carried away and/or disposed of. For example, in embodiments of the system 10 that are located in a vehicle, the heated fluid can be ejected from the vehicle and/or provided to the vehicle's climate control (e.g., HVAC) system. In some alternate embodiments, the dock 14 is in conductive thermal communication with the cold side of the thermal conditioning module 20 without an intervening conduction member 25 (e.g., the dock 14 is in direct contact with the thermal conditioning module 20).

In some embodiments, the inductive charging module 16 is cooled, either continuously or intermittently. For example, certain variants of the inductive charging module 16 are cooled by conductively transferring heat to the heat exchanger 21. In some implementations, the inductive charging module 16 is cooled by conductively transferring heat to the conduction member 25, which can transfer the heat to the thermal conditioning module 20. In certain alternate embodiments, the inductive charging module 16 is configured for conductive heat transfer to the thermal conditioning module 20, which, in some embodiments, can conductively transfer heat to the heat exchanger 21. Some other variants of the inductive charging module 16 are configured to convectively transfer heat directly to the fluid. For example, at least a portion (e.g., some, most, or or all) of the inductive charging module 16 can be positioned in or near the ducting 18 or can otherwise be in fluid communication with the fluid. In some implementations, the fluid is cooled prior to reaching the inductive charging module 16.

In some embodiments, such as shown in FIG. 1A, the inductive charging module 16 is positioned downstream of the thermal conditioning module 20 with regard to the flow of fluid in the ducting 18. In some embodiments, such designs result in the fluid receiving heat (e.g., heat from the hot side of the TED) from the thermal conditioning module 20 prior to receiving heat from the inductive charging module 16. In some embodiments, the inductive charging module 16 is positioned upstream of the thermal conditioning module 20. Some such designs result in the fluid receiving heat from the inductive charging module 16 prior to receiving heat from the thermal conditioning module 20. In certain embodiments, the inductive charging module 16 and the thermal conditioning module 20 are positioned generally at the same level (e.g., in parallel) with regard to the flow of fluid in the ducting 18. In some such designs, the fluid can receive heat from the inductive charging module 16 and the thermal conditioning module 20 substantially concurrently or concurrently.

Figure 1C:
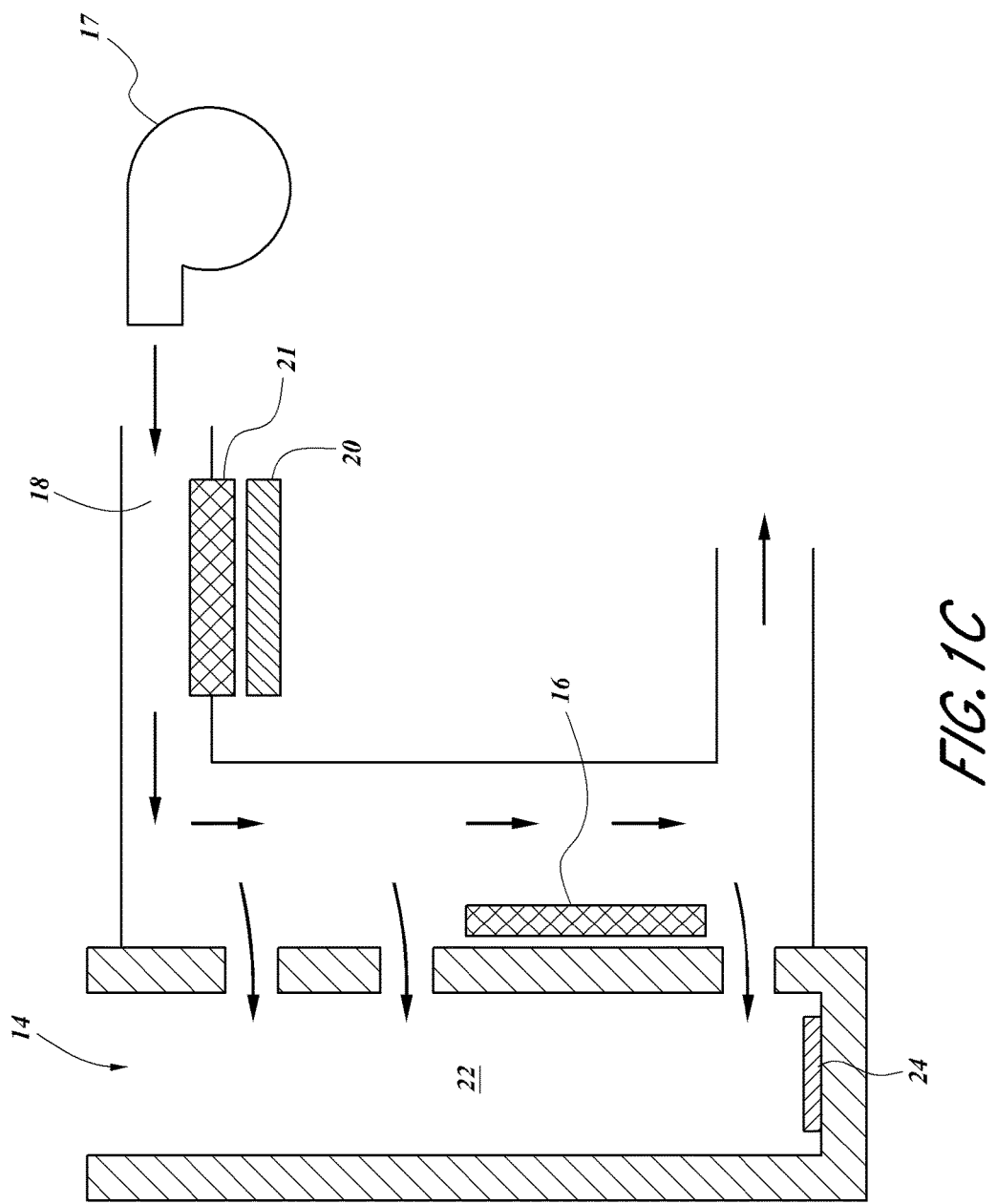
FIG. 1C schematically illustrates a second embodiment of the system of FIG. 1.

As illustrated in FIG. 1C, certain embodiments of the system 10 are configured to convectively cool the dock 14 and/or a PED located in the dock 14. In this regard, some embodiments of the dock 14 are in fluid communication with the ducting 18, such as by one or more apertures in the dock 14. In some embodiments, fluid from the from the fluid transfer device 17 can be cooled, such as by being passed over the cold side of the thermal conditioning module 20 and/or the heat exchanger 21 in thermal communication with the cold side of the thermal conditioning module 20. In some implementations, the fluid is also dehumidified. In some implementations, the fluid is generally unconditioned. The fluid can be provided to the dock 14, thereby convectively cooling the dock 14 and/or the PED. In certain implementations, the fluid enters a cavity 22 of the dock 14 via the apertures. In some such implementations, the fluid exits the cavity 22, such as into an interior space of the vehicle. As noted above, in some embodiments, the inductive charging module 16 is convectively cooled by the fluid. For example, in certain implementations, the fluid is allowed to pass along a surface of the inductive charging module 16.

Certain implementations are configured to additionally or alternately cool other electrical components, such as an entertainment system (e.g., radio, CD player, DVD player, and the like), navigation system, climate control (HVAC) system, and/or otherwise. In some embodiments, the other electrical components can be cooled by providing fluid (e.g., cooled air) to one or more of the other electrical components for convective heat transfer. In some embodiments, one or more of the other electrical components can be cooled by conductively transferring heat (e.g., via the conduction member 25 of FIG. 1A) to the cold side of the thermal conditioning module 20.

In some embodiments, the inductive charging module 16 and one or more of the other electrical components are positioned in a common location. For example, the inductive charging module 16 and one or more of the other electrical components can be positioned in a dashboard, center or rear console, armrest, floor, or door of a vehicle. Grouping the inductive charging module 16 and the one or more of the other electrical components in a common location can facilitate cooling of these components, increase efficiency, simplify maintenance, or otherwise. In some embodiments, the dock 14 is also positioned in the common location.

Figure 1D:
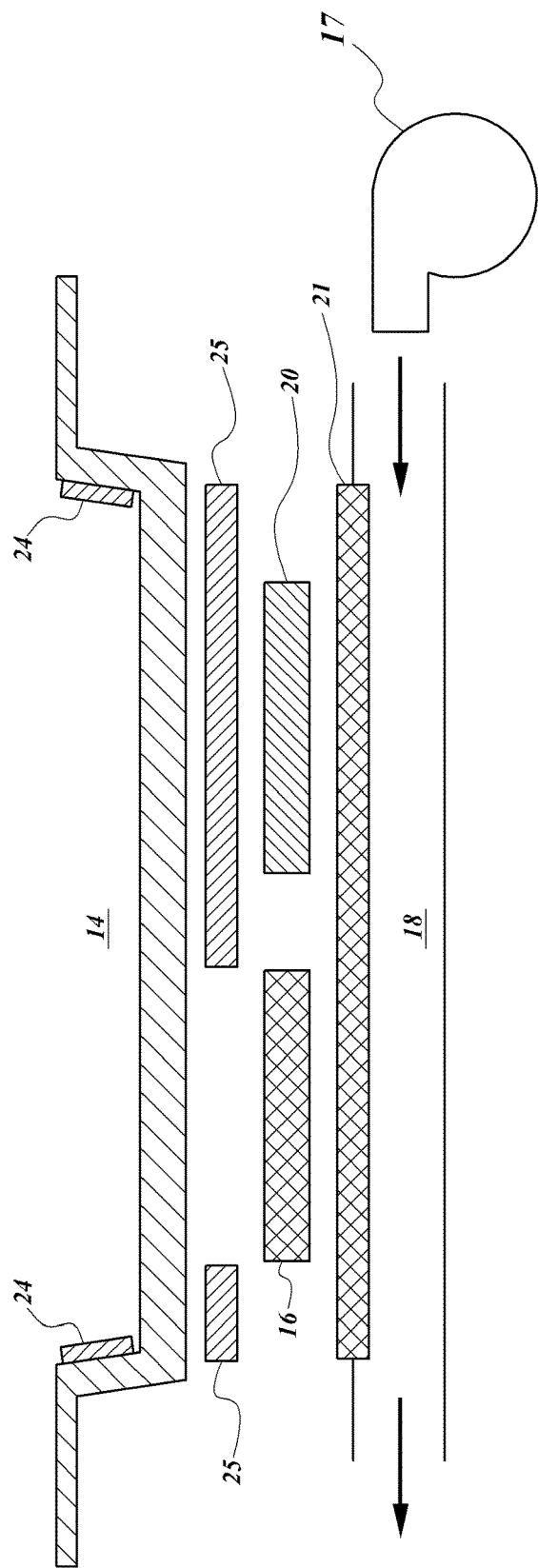
FIG. 1D illustrates a third embodiment of the system of FIG. 1.

Although the embodiments of the dock 14 shown in FIGS. 1A and 1C are generally vertically oriented (e.g., generally U-shaped in cross-section), which can facilitate securing items placed in the dock 14, other configurations are contemplated as well. For example, certain embodiments of the dock 14 are generally horizontally oriented, which can provide ready access to items placed in the dock 14, such as a PED. Various embodiments of the generally horizontally oriented dock are and/or are open or generally open to the surroundings. Other embodiments are closed or generally closed, such as with a door, cover, lid, etc. FIG. 1D illustrates an example of a generally horizontal configuration of the dock 14 that is configured for conductive heat transfer, and can function similarly to FIG. 1A described above. FIG. 1E illustrates an example of a generally horizontal configuration of the dock 14 that is configured for convective heat transfer, and that can function similarly to FIG. 1C described above. As shown, certain embodiments of the inductive charging module 16 are not positioned in the ducting 18, but are nevertheless configured to be cooled.

As discussed previously, some implementations of the dock 14 include one or more apertures for communicating with the ducting 18. Some implementations of the dock 14 have apertures on one side, two sides, three sides, four sides, or more. In certain variants, the ducting 18 includes a channel 18' around some, substantially all, or all of the perimeter of the dock 14. As shown in FIG. 1F, some variants of the dock 14 are configured such that a PED placed in the dock 14 is generally bathed in a flow of fluid from the fluid transfer device 17 via the channel 18'. For example, the fluid can be directed toward at least two sides of the PED. As shown, the apertures can be disposed a distance above the bottom of the dock 14, which can reduce the likelihood of spilled liquids or debris migrating into other portions of the system, as discussed in more detail below.

In various embodiments, the dock 14 is sized, shaped, and otherwise configured to accept a PED. For example, the dock 14 can be configured to contain, hold, and/or embrace the PED. Such a configuration can provide a place to store the PED, which can be helpful in restricting, partially or completely, inadvertent movement of the PED during operation of the vehicle (e.g., while driving). In certain embodiments, the dock 14 is configured such that a cell phone or other PED can be slidingly inserted into and removed from the dock 14. Some implementations have the dock 14 positioned in a dashboard or center console of an automobile, although various other locations are contemplated as well (e.g., in or near a door, a glove box or other storage container, an armrest, a rear seat console and/or the like).

In some embodiments, the cavity 22 of the dock 14 can be configured to receive all or a substantial portion of the longitudinal length of a cell phone or other PED. Such a configuration can, for example, facilitate securing and/or concealing (e.g., partially or completely) the cell phone or other PED. Certain embodiments of the cavity 22 have a height H of at least about: 3.0 inches, 3.5 inches, 4.0 inches, 4.5 inches, 5.0 inches, values in between, or otherwise. See FIG. 2B. In some embodiments, the cavity 22 is configured to receive only a portion of the longitudinal length of a PED, thereby providing a region, portion, or section (e.g., the portion of the PED that is not received in the cavity 22) to grasp to facilitate moving or otherwise handling (e.g., removing) the PED relative to the cavity 22. In other embodiments, the cavity 22 is configured to receive the entire or substantially the entire longitudinal length of the PED.

Some embodiments of the dock 14 include an aperture 23 through which a cell phone or other PED can be inserted. In some embodiments, the aperture 23 has a depth D and a width W that are sized and otherwise configured such that a cell phone or other PED can be inserted through the aperture 23 and at least partially into the cavity 22. See FIG. 2. Some variants of the aperture 23 have a width W of at least about: 2.0 inches, 2.5 inches, 2.75 inches, 3.0 inches, 3.25 inches, values in between, or otherwise. Some embodiments of the aperture 23 have a depth D of at least about: 0.25 inches, 0.38 inches, 0.50 inches, 0.62 inches, values in between, or otherwise. In other embodiments, however, the aperture 23 can be sized and configured to accommodate a PED having a length and/or width greater than indicated above. For example, the aperture can be configured to receive a tablet or other relatively large PED therein. In certain implementations, the cavity 22 is in fluid communication with the ambient environment surrounding the dock 14. In some embodiments, the cavity 22 can be configured to receive at least about 75% (e.g., about 70%, 72%, 74%, 76%, 78%, 80%, ranges between the foregoing percentages) of the volume of a cell phone or other PED. In other embodiments, however, the cavity 22 can be configured to receive greater than about 80% of the PED (e.g., about 80%, 85%, 90%, 95%, 100%, values between the foregoing percentages, etc.) or less than about 70% of the PED (e.g., about 40%, 45%, 50%, 55%, 60%, 65%, 70%, values between the foregoing percentages, less than about 40%, etc.), as desired or required. In some embodiments, the cavity 22 has a volume of at least about 4 cubic inches.

In some embodiments, such as is illustrated in FIGS. 1A, 1C, 1D and 1E, the dock 14 can include one or more stabilizing or protruding members 24, such as ribs, arms, bumps, ridges, fins, or other protruding members. In some variants, the protruding members 24 protrude at least partially into the cavity 22. Various embodiments of the protruding members 24 are configured to contact a PED that is inserted into the cavity 22, which can reduce or restrict vibration and/or other movement of the PED relative to the dock 14. Certain embodiments of the protruding members 24 are configured to space the PED a distance away from a wall (e.g., side wall or a bottom wall) of the dock 14. For example, as shown in FIG. 1A the protruding members 24 can be positioned on a bottom wall of the dock 14 and can be configured to maintain a distance between the PED and the bottom wall. Similarly, the protruding members 24 can be positioned on a side wall of the dock 14 and can be configured to maintain a distance between the PED and the side wall. In certain variants, channels (e.g., passages or gaps) are positioned between adjacent protruding members 24 and can provide a fluid flow path. In some embodiments, the protruding members 24 are made of one or more resilient materials, such rubber, plastic and/or the like. The protruding members 24 can comprise one or more other materials and/or components, either in addition to or in lieu of plastic and/or rubber, as desired or required. For example, the protruding members 24 can include one or more springs or other resilient members or materials. In some embodiments, the protruding members 24 extend along generally the entire longitudinal dimension of the dock 14. In some embodiments, the protruding members 24 are configured to promote fluid flow when a PED is installed in the cavity 22, as will be discussed in further detail below.

FIGS. 2-2B show an illustrative embodiment of the cooling system 10 that includes certain of the heat transfer features described above, such as the inductive charging module 16, dock 14, and fluid transfer device 17 (e.g., fan, blower, etc.). During operation of the system 10, the inductive charging module 16 can wirelessly transfer power to a PED located in the dock 14, which can generate heat in the inductive charging module 16, dock 14, and/or the PED. Also during operation, the fluid transfer device 17 can draw in fluid (e.g., air) via an upper or lower aperture and can encourage the fluid into the ducting 18. The fluid can pass over and/or through the thermal conditioning module 20 (e.g., TED), which can decrease the temperature of the fluid by transferring heat from the fluid to the thermal conditioning module 20. In some embodiments, the fluid is directed, at least partially, into the cavity 22 of the dock 14. Accordingly, heat from the inductive charging module 16 and/or a PED located in the dock 14 can be transferred via convection to the fluid.

In various implementations, the cooled fluid travels through a portion of the dock 14. For example, the cooled fluid can travel along some, substantially all, or all of the height H of the cavity 22 of the dock 14. In some implementations, the cooled fluid can travel along some, substantially all, or all of the height of the PED positioned within the dock. In some embodiments, the fluid can emerge from the dock 14 into the ambient environment, such as into a passenger cabin of a vehicle. In some embodiments, the fluid can be routed to one or more portions of the vehicle (e.g., the exterior of the vehicle, below or away from the console or seat assembly, etc.), as desired or required.

In certain embodiments, the system 10 is configured to transfer sufficient heat from the PED to maintain the PED below a threshold temperature. For example, some embodiments of the system 10 can adjust the temperature, rate, and/or volume of fluid to maintain the temperature of the dock 14 and/or the PED below a setpoint temperature, such as less than or equal to about: 15° C., 21° C., 26° C., 32° C., 38° C., 43° C., 49° C., values between the aforementioned values, and otherwise. Some such embodiments include a controller or switch configured to control operation of the fluid transfer device 17 and/or the thermal conditioning module 20. Certain implementations of the system 10 are configured to at least offset the heat generated by the inductive charging module 16 and/or the PED located in the dock 14.

As illustrated in FIG. 2, in some embodiments, fluid from the ducting 18 enters at or near the bottom end 32 of the dock 14. To facilitate the entry of the fluid, the opening 28 in the dock 14 can be positioned at or near the bottom end 32. However, as discussed elsewhere herein, other configurations are contemplated as well.

As noted above, in some embodiments, the dock 14 comprises one or more protruding members 24. In some implementations, the protruding members 24 can be configured to promote fluid flow even when the PED is positioned in the dock 14. For example, protruding members 24 can be positioned and otherwise configured to at least partially define and/or maintain one or more channels 30. Such a design can be beneficial because, when a PED is positioned in the dock 14, a substantial volume of the cavity 22 may be occupied by the PED and thus restrict fluid flow. The protruding members 24 can be configured to space an edge of the PED away from a wall of the dock 14, thereby providing a passage for fluid flow via the channels 30.

In some embodiments, a bottom end 32 of the dock 14 (e.g., the portion which is adjacent or near a lower portion of the PED that is positioned within the dock 14) comprises one or more support members (not shown), such as ribs, dimples, grooves, and/or other features. In some embodiments, the support members are configured to support the weight of some, substantially all, or all of the PED located in the dock 14. The support members can be configured to promote fluid flow between the bottom of the PED and the bottom end 32 of the dock 14. For example, some embodiments of the support members space the bottom of the PED from the bottom end 32 of the 14, which can promote cooling on the PED when the system 10 is in use. Thus, in certain respects, the support members can function similarly to the protruding members 24 discussed above, such as by defining and/or maintaining a passage for fluid flow between the PED and the dock 14.

As illustrated in FIG. 2B, some embodiments include a cantilevered support member 34 that extends from one generally vertical wall of the dock 14. In some embodiments, the cantilevered support member 34 extends toward an opposite generally vertical wall. In some implementations, the support member can be configured to receive the bottom portion of a PED that is received in the dock 14. As shown, the cantilevered support member 34 can be disposed a particular distance apart from the bottom end 32, thus the support member 34 can space the PED away from the bottom end 32 to facilitate fluid flow underneath the PED. In certain embodiments, the cantilevered support member 34 is configured to direct fluid toward one or more of the channels 30. As discussed herein, in at least some configurations, such spaces, channels, and other features can further facilitate in promoting efficient and effective cooling of a PED.

In certain embodiments, the dock 14 include sculpted or recessed features, such as shoulders 26, which can be configured to facilitate stabilization and/or securement (e.g., grasping) of a PED that is inserted into the cavity 22. Some variants of the shoulders 26 include curves or angles so as to direct a PED into general alignment with the dock 14 during installation of the PED into the dock 14. For example, the shoulders 26 can be positioned at or near an upper edge of the dock 14 and can include a curve or chamfer to facilitate guiding a PED into the dock 14.

FIGS. 3-3B illustrate another embodiment of a cooling system 10a. Several features and components of the cooling system 10a are identical or similar in form and function to those described above with respect to the cooling system 10, and thus have been provided with like numerals, with the addition of "a." Any features and/or components of the disclosed embodiments can be combined or used interchangeably.

According to some embodiments, the system 10a includes one or more of the following: an inductive charging module 16a, a fluid transfer device 17a, and a thermal conditioning module 20a. In certain variants, air or other fluid enters a dock 14a via an opening 28a positioned on a wall of the dock 14a. The fluid can then pass into a cavity 22a in the dock 14a, which can be configured to receive some or all of the PED.

In certain implementations, the opening 28a is disposed a distance away from a bottom end 32a of the dock 14a. Such a design can reduce the likelihood of spilled liquids or debris migrating into the fluid transfer device 17a, ducting 18a, thermal conditioning module 20a (e.g., TED), other electrical and/or other sensitive components. For example, in certain embodiments, the opening 28a is spaced a sufficient distance above the bottom end 32a such that spilled liquid (such as water, coffee, soft drinks, etc.) or debris (such as crumbs, other food items, dust, dirt, lint, etc.) can be contained in the bottom end 32a, thereby facilitating clean-up and/or inhibiting such spills from entering the fluid transfer device 17a, ducting 18a, and/or thermal conditioning module 20a. According to certain embodiments, the opening 28a is spaced apart from the bottom end 32a of the dock 14a by at least about: 5 mm, 10 mm, 15 mm, 20 mm, 25 mm, 30 mm, 40 mm, 50 mm, values between the aforementioned values, and otherwise. In some implementations, the opening 28a is located between a vertical top end and the bottom end 32a of the dock 14a. In certain variants, the opening 28a is located about half-way along the height H of the dock 14a.

As illustrated in FIG. 3B, the dock 14a can include one or more vanes 36a, which can be positioned near or adjacent the opening 28a. In certain embodiments, the vane 36a extends partly from one wall of the dock 14a and is configured to provide a desired space between the vane 36a and the opposite wall such that a PED can be inserted therebetween. In some variants, the vane 36a is configured to at least partially direct fluid flow, as desired or required. For example, the vane 36a can direct some or all of the fluid (e.g., air) passing through the opening 28a toward the bottom end 32a. As shown, the ribs or other protruding members 24a can extend along the bottom end 32a, thereby providing an elevated support surface on which the PED can rest while allowing the fluid to flow under the PED and through the channels 30a.

Figure 4:
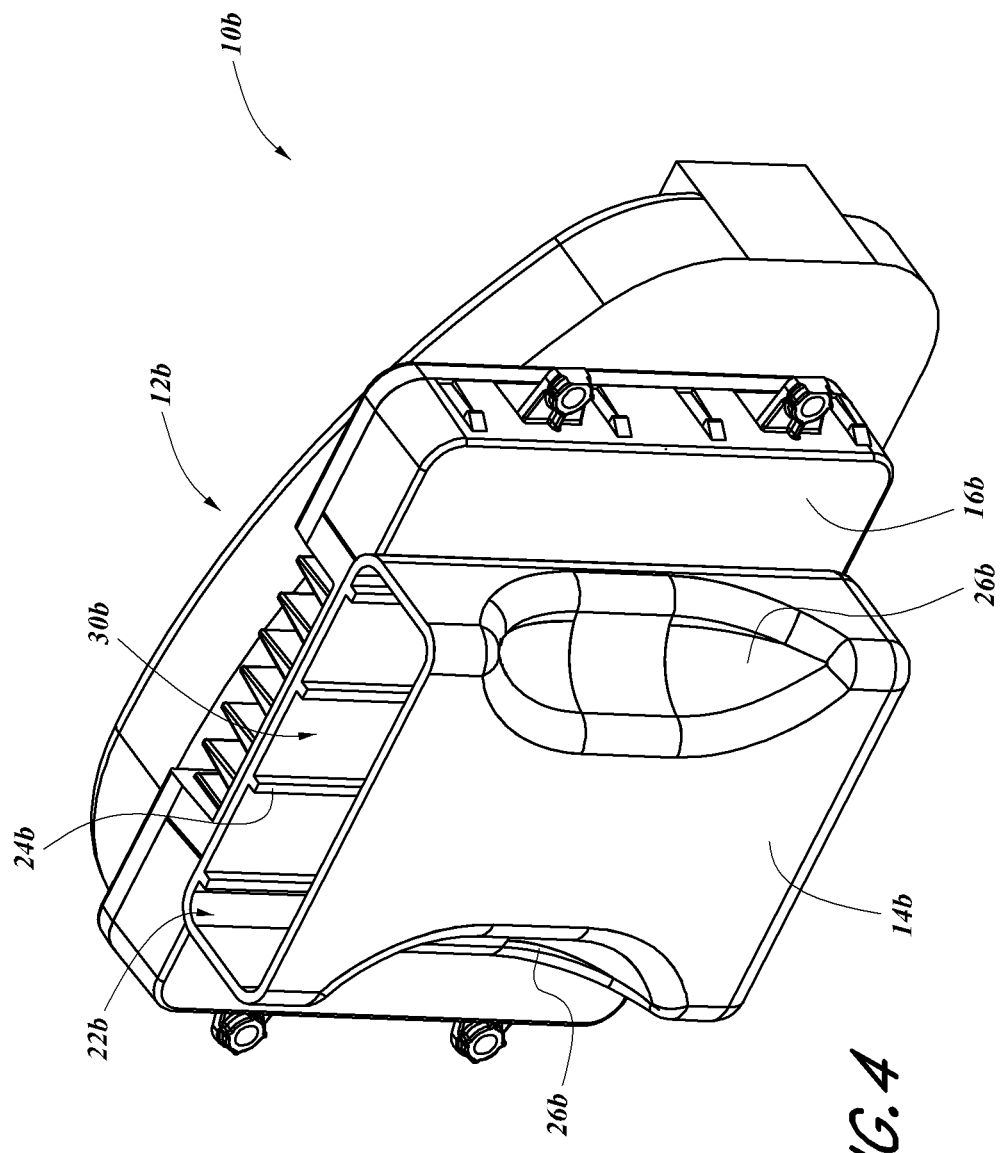
FIG. 4 illustrates a front perspective view of another embodiment of a cooling system for an inductive charger comprising a thermal conditioning module connected with an inductive charging module, which is connected with a dock.

FIGS. 4-4B illustrate another embodiment of a cooling system 10b. Several features and components of the cooling system 10b are identical or similar in form and function to those described above with respect to the cooling systems 10, 10a and thus have been provided with like numerals, with the addition of "b." Any features and/or components of the disclosed embodiments can be combined or used interchangeably.

In various embodiments, the system 10b includes one or more of the following: an inductive charging module 16b, a fluid transfer device 17b, ducting 18b, and a thermal conditioning module 20b. In some implementations, air or other fluid can be directed (e.g., via the fluid transfer device 17b and ducting 18b) along and/or through a portion of the inductive charging module 16b in order to cool the inductive charging module 16b, a dock 14b, and/or a PED positioned in the dock. As illustrated, certain implementations of the inductive charging module 16b are located between the dock 14b and the fluid transfer device 17b and/or the thermal conditioning module 20b. Such a configuration can provide a compact design that can, for example, facilitate installation of the system 10b, allow the system 10b to be employed in tight quarters, and/or reduce the space occupied by the system 10b in comparison to some other designs.

With reference to FIG. 4B, certain embodiments of the system 10b are configured such that at least some of the fluid passes through the inductive charging module 16b. In this regard, the inductive charging module 16b can comprise a portion of the ducting 18b. In some implementations, the ducting 18b fluidly connects the fluid transfer device 17b (e.g., fan) and with an interior portion 40b of the inductive charging module 16b. For example, the interior portion 40b can be configured to receive or mate with the ducting 18b. In the embodiment of FIG. 4B, the ducting 18b enters the interior portion 40b at a bottom portion of the inductive charging module 16b. In other variants, the ducting 18b enters the interior portion 40b in other locations, such as on a side, top, front, back, or corner of the inductive charging module 16b and/or the like, as desired or required.

In some embodiments, the ducting 18b is configured to enhance the heat dissipation from the inductive charging module 16b. For example, in some embodiments, the ducting 18b is configured to direct fluid over and/or through convective heat transfer facilitating structures, such as fins 38b, of the inductive charging module 16b. In certain embodiments, the fins 38b are positioned in the interior portion 40b. In other implementations, the fins 38b are positioned on an external surface of the inductive charging module 16b.

In certain variants, the interior portion 40b is divided from another portion of the inductive charging module 16b by one or more barriers 42b (e.g., walls, baffles, or other dividing members). The barriers 42b can be configured to prevent, inhibit, or reduce the likelihood of the migration of dirt, dust, other particles, or other undesirable substances from reaching the electronic components of the inductive charging module 16b. In some embodiments, such a barrier 42b is configured to direct the flow of fluid, for example, toward a front wall of the inductive charging module 16b.

Figure 4A:
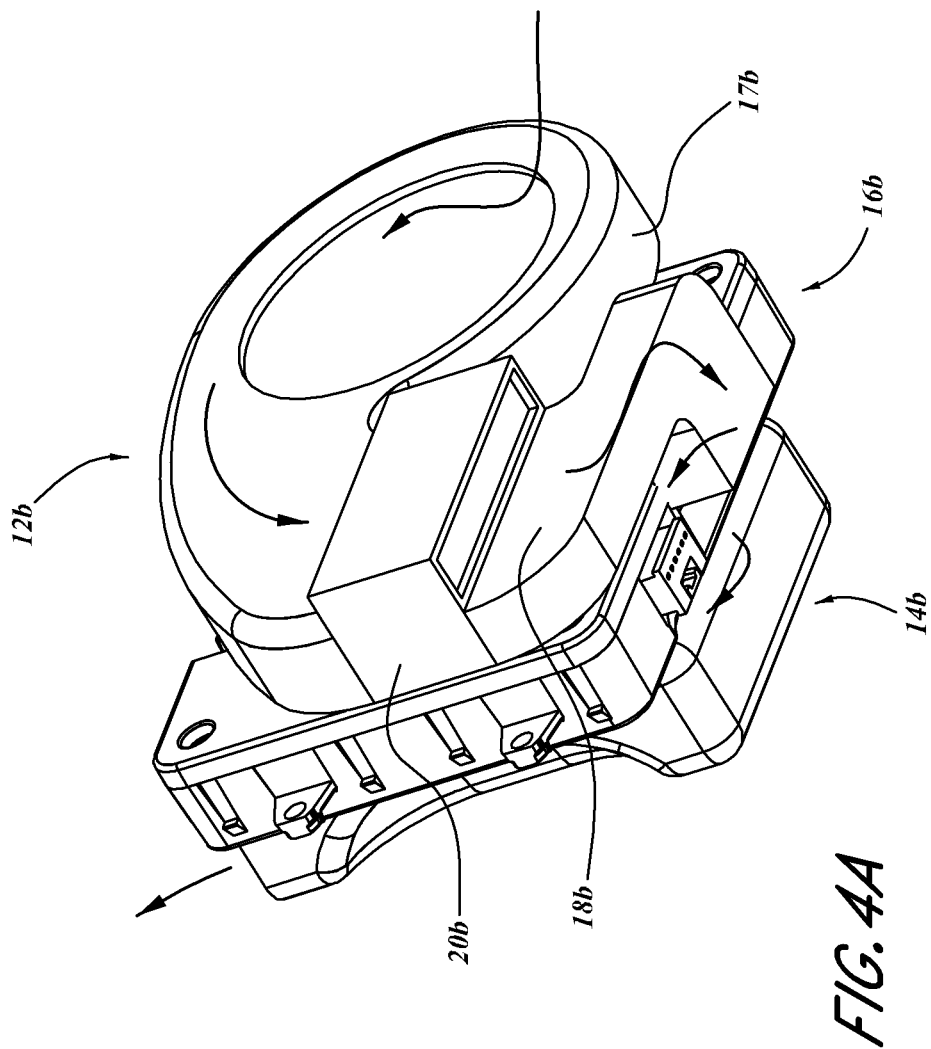
FIG. 4A illustrates a bottom perspective view of the system of FIG. 4.

As illustrated in FIG. 4A, the inductive charging module 16b and the dock 14b can be mounted together. To facilitate fluid flow between these components, as shown in FIG. 4B, certain embodiments of the inductive charging module 16b can include an opening 44b (e.g., in a front wall). The opening 44b can be configured to at least partially align or otherwise coincide with an opening 28b of the dock 14b when the inductive charging module 16b and the dock 14b are mounted together. Thus, fluid in the interior portion 40b of the inductive charging module 16b can flow into the dock 14b. Accordingly, during operation of the system 10b, and as is shown by the arrows in FIG. 4A, air or other fluid can flow from the fluid transfer device 17b along and/or through the thermal conditioning module 20b, thereby thermally conditioning (e.g., cooling and/or dehumidifying) the fluid in a desired manner. The conditioned fluid can flow through the ducting 18b into the interior portion 40b. In some embodiments, the fluid can flow through the opening 44b in the inductive charging module 16b and the opening 28b in the dock 14b, where it can convectively cool the dock 14b and/or a PED mounted in the dock 14b. In some embodiments, the fluid exits the dock 14b and enters the vehicle's ambient environment, for example, by flowing through channels 30b and/or between the ribs 24b of the dock 14b.

In certain embodiments, at least some of the conditioned fluid can be configured for conductive heat transfer. For example, a portion of the fluid can be directed along or through a heat exchanger (not shown), which can be in conductive thermal communication with the dock 14b, a PED disposed in the dock 14b, and/or the inductive charging module 16b, thereby transferring heat from one or more of those components to the conditioned fluid.

Various embodiments of the systems 10, 10a, 10b are configured to operate with an ambient air temperature of less than or equal to about 85° C. In some implementations, the systems 10, 10a, 10b are configured to provide at least about: 4 watts, 5, watts, 6 watts, 7 watts, 8 watts, 9 watts, values in between the foregoing values, and/or otherwise of heat dissipation. In other embodiments, the cooling system is configured to provide at least about 4 watts and/or less than or equal to about 9 watts of heat dissipation.

In some embodiments, the systems 10, 10a, 10b are configured to compensate for (e.g., dissipate, offset, negate, or otherwise) at least some of the heat produced by the inductive charging module and/or the PED. Certain embodiments are configured to dissipate at least about 4 watts generated by the inductive charging module 16, 16a, 16b and at least about 3 watts generated by the PED. In certain embodiments, the systems 10, 10a, 10b are configured to offset at least about: 50%, 60%, 70%, 80%, 85%, 90%, 95%, 99%, 100%, values in between the aforementioned values, or otherwise, of the heat generated by the inductive charging module during inductive charging of the PED. In certain variants, the systems 10, 10a, 10b are configured to offset all or substantially all of the heat generated by the inductive charging module during inductive charging of the PED. In some implementations, the systems 10, 10a, 10b are configured to offset more than the heat generated by the inductive charging module during inductive charging of the PED.

Various embodiments of the system 10, 10a, 10b are configured to compensate for an environmental heat load, such as heat from the ambient in which the dock 14 is located. For example, for embodiments of the system that are located in a vehicle, the temperature inside that vehicle may be substantially higher than the temperature outside the vehicle, such as when that vehicle is parked in the sun. These elevated temperature can increase not only the temperature of the dock 14, but also the temperature of the air that is present in the cavity 22 of the dock 14. Some embodiments of the system 10, 10a, 10b are configured to compensate for such environmental heat loads. For example, the system 10, 10a, 10b can be configured to compensate for (e.g., offset, dissipate, negate, or otherwise) an elevated temperature of the dock 14, such as at least about: 39° C., 43° C., 49° C., values in between the aforementioned values, or otherwise. Some embodiments are configured to compensate for an elevated temperature of the air in the cavity 22, such as at least about: 38° C., 49° C., 59° C., values in between the aforementioned values, or otherwise.

Because some PEDs will shutdown or enter a decreased functionality mode after reaching a temperature limit (e.g., between about 60° C. and about 70° C.), some implementations of the system 10, 10a, 10b are configured to bring and/or maintain the temperature of the dock 14 and/or the PED in the dock 14 below an upper temperature limit. For example, some embodiments are configured to provide sufficient heat transfer such that the temperature of the dock 14 and/or the PED in the dock 14 is below about: 40° C., 45° C., 50° C., 55° C., 60° C., 65° C., values in between the aforementioned values, or otherwise.

In certain implementations, the system 10, 10a, 10b is configured to bring the temperature of a PED placed in the dock 14 down to a desired temperature within a certain amount of time. For example, some variants are configured such that, from the time the PED is placed in the dock 14 and the system 10, 10a, 10b is operating, the temperature of the PED can be brought down to a temperature of less than about 60° C. within about: 5 minutes, 10 minutes, 15 minutes, values in between the aforementioned values, or otherwise. Other variants are configured such that, from the time the PED is placed in the dock 14 and the system 10, 10a, 10b is operating, the temperature of the PED can be brought down to a temperature such that the PED is comfortable for a person to hold and/or use (such as less than or equal to about 43° C.) within about: 5 minutes, 10 minutes, 15 minutes, values in between the aforementioned values, or otherwise.

Various implementations of the system 10, 10a, 10b are configured to interact, engage with, signal, or otherwise coordinate with other systems of the vehicle. For example, some or all of the system 10, 10a, 10b can be configured to operate only during operation of the vehicle, such as after the ignition switch has been activated. In some embodiments, some or all of the system 10, 10a, 10b operates only when a PED is determined to be in the dock 14, such as via a contact or proximity switch. For example, the inductive charging module 16 can be configured to operate only when a PED is determined to be in the dock 14. In some variants, the inductive charging module 16 is configured to operate only if the temperature of the dock 14 is determined to be below a certain threshold, such as less than about 40° C., 45° C., 50° C., 55° C., 60° C., 65° C., values in between the aforementioned values, or otherwise.

In some embodiments, the vehicle can communicate with the PED to determine whether the PED is in or near the vehicle. In some such embodiments, if the PED is determined to be in or near the vehicle, then some or all of the system 10, 10a, 10b can be signaled to begin operation, such as by the controller. For example, the fluid transfer device 17 and/or the thermal conditioning module 20 can start operating in order to cool the dock 14. In certain such instances, the cooling may occur even before the PED is placed into the dock 14. Such pre-PED-insertion cooling of the dock 14 can reduce the likelihood of the PED going into thermal shutdown after insertion into the dock 14 due to the temperature of the dock 14 (e.g., due to solar loading).

In some embodiments, the fluid transfer device 17 and/or the thermal conditioning module 20 are configured to operate only if a condition is met. In some variants, the condition is that the inductive charging module 16 is operating. In certain implementations, the condition is that a period of time has elapsed, such as greater than or equal to about: 30 seconds, 1 minute, 2 minutes, 5 minutes, values therebetween, and otherwise. In some embodiments, the condition is the detection that a temperature (e.g., the temperature of the dock 14, PED in the dock 14, inductive charging module 16, and/or vehicle ambient temperature) is greater than or equal to a threshold, such as at least about: 40° C., 45° C., 50° C., 55° C., 60° C., 65° C., values in between the aforementioned values, or otherwise. In certain variants, the condition is that the inductive charging module 16 is operating.

Similarly, certain implementations of the inductive charging module 16 are configured to operate only after a condition is met. For example, some embodiments of the inductive charging module 16 are configured to operate only when the vehicle is in operation (e.g., the vehicle ignition has been activated, the fluid transfer device 17 and/or the thermal conditioning module 20 are operating, or otherwise). Several variants are configured to operate only after a temperature (e.g., of the dock 14) has been determined to be at or below a temperature value (e.g., about: 80° C., 70° C., 60° C., 50° C., 40° C., values in between the aforementioned values, or otherwise). Certain implementations use such a postponement of the operation of the inductive charging module 16—and its attendant heat production—to decrease the temperature of the dock 14 and/or the PED before engaging the inductive charging function. In certain designs, by decreasing the temperature (e.g., of the dock 14) and subsequently operating the inductive charging functionality, the PED can be charged generally immediately upon being engaged with the dock 14 and/or the risk of thermal shutdown of, or damage to, the PED can be reduced. Some variants of the inductive charging module 16 are configured to operate only after a period of time has elapsed. For example, a period (e.g., of at least about 5 seconds, 10, seconds, 30 seconds, 1 minute, 2 minutes, values therebetween, and otherwise) that elapses between an initiating action (e.g., activation of the vehicle ignition, insertion of the PED into the dock 14, determination that the PED is within a vicinity (e.g., of the dock 14), receipt of an activation signal from the controller or a user, or otherwise) and the initiation of inductive charging.

With reference to FIG. 5, some embodiments of the various docks 14 and/or cooling systems 10, 10a, 10b described herein are located at least partly in a console 50, such as a cabinet, panel, armrest, or otherwise. Certain embodiments of the console 50 are located in a vehicle, such as a center console between the two front seats in many vehicles. FIG. 5 illustrates an embodiment of the console 50 including a generally horizontally oriented dock 14, such as is shown in FIGS. 1D and 1E. However, other embodiments of the console 50 can include a generally vertically oriented dock 14, such as is shown in FIGS. 1A, 1C, and 2-4C. In various embodiments, the dock 14 in the console 50 can be conditioned (e.g., cooled or dehumidified), such as with any of the systems 10, 10a, 10b described herein.

In some embodiments, the console 50 includes a container 52 (e.g., a bin, cubby, reservoir, box, or otherwise) that can be used for storage of various items. In some instances, the container 52 is configured to store items such as maps and other navigational aids, entertainment media, writing instruments, coinage and other currency, and other items that do not require cooling in addition to the normal climate control provided by the vehicle. In other instances, the container 52 is configured to store items for which supplemental conditioning (e.g., cooling) is desired or required, such as certain foods or drinks. In this regard, certain embodiments of the systems 10, 10a, 10b are configured to cool the container 52, such as by providing cooled fluid to an interior of the container 52. Some embodiments are configured to cool the interior of the container 52 by conduction, such as with a thermal conditioning member and/or a conduction member in conductive thermal communication with the container 52. Various embodiments of the systems 10, 10a, 10b are configured to simultaneously provide cooling or other conditioning to the dock 14 and the container 52. However, some variants are configured to cool only one or the other of the dock 14 and the container 52. In some embodiments, the systems 10, 10a, 10b are configured to control the amount of cooling provided to the dock 14 and the container 52. For example, if the temperature of the dock 14 or the container 52 is determined to be at or above a certain temperature (e.g., greater than or equal to about: 5° C., 10° C., 15° C., 37° C., 43° C., 49° C., 55° C., values in between the aforementioned values, or otherwise), then additional cooling can be supplied to that component by temporarily stopping cooling to the other of the dock 14 and the container 52.

As shown in FIG. 5A, in some embodiments, some or all of the system 10, 10a, 10b is located generally between the dock 14 and the container 52. In some other embodiments, the cooling system 10, 10a, 10b is located generally on a side of one or both of the dock 14 and the container 52, such as is shown in FIG. 5B. Certain implementations have the cooling system 10, 10a, 10b located near a bottom portion of the container 52. In various embodiments, the cooling system 10, 10a, 10b can include a heat sink, fins, or other heat transfer facilitating structures.

FIG. 6 illustrates an embodiment in which the system 10, 10a, 10b is configured to cool a vehicle inductive charging system. Certain vehicles 100 can be equipped for wireless charging of a power source 60, such as a battery or other storage medium, via an inductive charging module 16. In some configurations, the inductive charging module 16 is mounted in a location in which the vehicle 100 is generally stationary, such as overhead or in the ground at a garage, parking space, or stoplight. When the vehicle 100 is positioned generally under, over, or near the inductive charging module 16, wireless charging of the power source may occur via the electromagnetic field produced by the inductive charging module 16. In other configurations, the inductive charging module 16 is mounted in location in which the vehicle 100 is normally in motion, such as overhead or in the ground along a highway or street. As the vehicle 100 travels under, over, or near the inductive charging module 16, wireless charging of the power source may occur via the electromagnetic field produced by the inductive charging module 16. Moreover, the relative motion of the vehicle 100 and the inductive charging module 16 can facilitate the wireless charging. In various embodiments, the cooling system 10, 10a, 10b is configured to cool or otherwise condition a portion of the inductive charging module 16. In some embodiments, the cooling system 10, 10a, 10b is configured to cool or otherwise condition a portion of the battery or other power storage medium. In some embodiments, the cooling system 10, 10a, 10b is located in the vehicle 100, such as in the dashboard, passenger compartment, engine compartment, trunk, or otherwise. In some embodiments, the system 10, 10a, 10b is generally stationary and located separate from the vehicle 100, such as being in the ground or overhead. In some implementations, the system comprises the vehicle 100 (e.g., an automobile). Other embodiments do not comprise the vehicle 100.

For purposes of summarizing the inventions disclosed herein and the advantages achieved over the prior art, certain objects and advantages of the inventions are described herein. Of course, not all such objects or advantages need to be achieved in accordance with any particular embodiment. Thus, for example, those skilled in the art will recognize that the inventions may be embodied or carried out in a manner that achieves or optimizes one advantage or group of advantages as taught or suggested herein without necessarily achieving or optimizing other objects or advantages as may be taught or suggested herein.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. For example, various embodiments are described herein than can include a fluid transfer device. However, other embodiments within the scope of this disclosure do not include a fluid transfer device. As another example, some embodiments are discussed herein that can include a thermal conditioning module. However, several other embodiments do not include a thermal conditioning module. Certain embodiments are configured for cooling with generally unconditioned fluid, such as generally uncooled air. In some such embodiments, the dock and/or inductive charging module are convectively cooled by the fluid. In certain embodiments, heat is conductively transferred away from the dock and/or inductive charging and then transferred to the generally unconditioned fluid.

The terms "approximately", "about", "generally", and "substantially" as used herein represent a value, amount, or characteristic close to the stated value, amount, or characteristic that still performs a desired function or achieves a desired result. For example, the terms "approximately", "about", "generally", and "substantially" may refer to a value, amount, or characteristic that is within less than 10% of, within less than 5% of, within less than 1% of, within less than 0.1% of, and within less than 0.01% of the stated value, amount, or characteristic.

Many variations and modifications may be made to the herein-described embodiments, the elements of which are to be understood as being among other acceptable examples. All such modifications and variations are intended to be included within the scope of this disclosure. For example, the system of FIG. 1A and the system of FIG. 1C can be combined to yield a further embodiment within the scope of this disclosure. As another example, although the illustrations show the components of the various cooling systems in the general vicinity of the dock 14, embodiments in which one or more components (e.g., the fluid transfer device, thermal conditioning module, and/or heat exchanger) are located remote from the dock 14 are also within the scope of this disclosure.

Additionally, as noted above, any features and/or components of the disclosed embodiments can be combined or used interchangeably. For example, although FIGS. 2-4C illustrate embodiments with a generally vertically oriented dock (such as is schematically shown in FIGS. 1A-1C), other contemplated embodiments include a generally horizontally oriented dock (such as is schematically shown in FIGS. 1D and 1E). As a further example, although certain embodiments are described as being configured for convective heat transfer, such embodiments can alternatively or additionally be configured for conductive heat transfer, such as with a conduction member. Likewise, although certain embodiments are described as being configured for conductive heat transfer, such embodiments can alternatively or additionally be configured for convective heat transfer, such as with an opening in the dock for cooled fluid to pass through.

The following is claimed:

1. A method of cooling for an inductive charging module, the method comprising:
   directing an airflow through a thermal conditioning module comprising a duct;
   directing the airflow through the duct to a dock from a first opening of a first end of the dock to a cavity of the dock;
   directing the airflow along at least one rib in the cavity, the at least one rib protruding from at least one wall of the dock, the at least one wall at least partially defining the cavity, and the at least one wall configured to connect to an inductive charging module configured to charge a portable electronic device; and
   directing the airflow to a second opening of a second end of the dock, the second end opposite the first end, and the second end configured to receive the portable electronic device into the cavity,
   wherein the at least one rib is configured to space the portable electronic device from the at least one wall within the cavity for the airflow to flow at least along a portion of the portable electronic device to cool the portable electronic device.

2. The method of claim 1, further comprising directing the airflow through the dock via an air moving device connected to the duct.

3. The method of claim 1, further comprising securing the portable electric device within the cavity via the at least one rib.

4. The method of claim 1, wherein the portable electronic device comprises a cell phone.

5. The method of claim 1, wherein the dock is disposed in an automobile.

6. The method of claim 1, wherein the airflow along the at least a portion of the portable electronic device at least partially offsets the heat generated by the inductive charging module during inductive charging of the portable electronic device.

7. The method of claim 1, further comprising providing at least about 6 watts of heat dissipation.

8. The method of claim 1, further comprising cooling the airflow via a thermoelectric device before directing the airflow to the dock.

* * * * *